United States Patent
Kodama

(10) Patent No.: US 10,490,508 B2
(45) Date of Patent: Nov. 26, 2019

(54) METHOD OF MANUFACTURING SEMICONDUCTOR DEVICE

(71) Applicant: FUJI ELECTRIC CO., LTD., Kawasaki-shi (JP)

(72) Inventor: Naoko Kodama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/166,529

(22) Filed: Oct. 22, 2018

(65) Prior Publication Data

US 2019/0206803 A1 Jul. 4, 2019

(30) Foreign Application Priority Data

Dec. 28, 2017 (JP) ................. 2017-255006

(51) Int. Cl.
*H01L 21/68* (2006.01)
*H01L 23/544* (2006.01)

(52) U.S. Cl.
CPC .. *H01L 23/544* (2013.01); *H01L 2223/54426* (2013.01); *H01L 2223/54433* (2013.01); *H01L 2223/54453* (2013.01)

(58) Field of Classification Search
CPC ......... H01L 21/677; H01L 21/68; G03F 7/70; G03F 9/70
See application file for complete search history.

(56) References Cited

U.S. PATENT DOCUMENTS 8,742,476 B1 * 6/2014 Or-Bach ............ H01L 27/0688
257/275

FOREIGN PATENT DOCUMENTS

JP 2012-895540 A 5/2012

\* cited by examiner

*Primary Examiner* — Mohammad M Choudhry

(57) ABSTRACT

A back alignment mark on a surface of a semiconductor substrate is detected and a resist mask patterned into a circuit pattern corresponding to a surface element structure is formed on a back of the semiconductor substrate. Detection of the back alignment mark is performed by using a detector opposing the back of the semiconductor substrate and measuring contrast based on the intensity of reflected infrared light irradiated from the back of the semiconductor substrate. The back alignment mark is configured by a step formed by the surface of the semiconductor substrate and bottoms of trenches formed from the surface of the semiconductor substrate. A polysilicon film is embedded in the trenches. The back alignment mark has, for example, a cross-shaped planar layout in which three or more trenches are disposed in a direction parallel to the surface of the semiconductor substrate.

12 Claims, 29 Drawing Sheets

FIG.22

| | MARK 1: COMPARTIVE EXAMPLE | MARK 2 | MARK 3 | MARK 4 |
|---|---|---|---|---|
| MARK PATTERN | | | | |
| IR IMAGE (WITH DETECTED WAVEFORM) | | | | |

FIG.23

| | MARK 5 | MARK 6 | MARK 7 | MARK 8 |
|---|---|---|---|---|
| MARK PATTERN | | | | |
| IR IMAGE (WITH DETECTED WAVEFORM) | | | | |

FIG.24

| Si THICKNESS | | NO COVERING METAL FILM | | WITH COVERING METAL FILM | |
|---|---|---|---|---|---|
| | | RC-IGBT | FWD | RC-IGBT | FWD |
| | 100μm | ○ | × | ○ | ○ |
| | MORE THAN 101μm TO 150μm | ○ | × | ○ | ○ |
| | MORE THAN 151μm TO 300μm | × | × | ○ | ○ |
| | MORE THAN 301μm TO 400μm | × | × | ○ | ○ | ns
METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-255006, filed on Dec. 28, 2017, the entire contents of which are incorporated herein by reference.

BACKGROUND

1. Field

Embodiments of the invention relate to a method of manufacturing a semiconductor device.

2. Description of Related Art

Conventionally, in alignment for patterning a circuit pattern corresponding to a surface element structure on a surface (first main surface) of a semiconductor substrate (semiconductor wafer), on a back (second main surface) of the semiconductor substrate or on a material film on the back, use of an alignment mark formed with a surface element structure on a surface of a semiconductor substrate (hereinafter, "back alignment mark") is commonly known.

As an alignment method using infrared light, there has been proposed a method of forming a back alignment mark of an SON (Silicon-On-Nothing) structure inside an ineffective region, such as a dicing line on a silicon wafer, thereby enabling recognition of the back alignment mark with a change of reflected light of red laser (transmission laser) (for example, see Japanese Laid-Open Patent Publication No. 2012-089540 (paragraphs to and FIGS. 5 and 7)). In Japanese Laid-Open Patent Publication No. 2012-089540, a plurality of hole trenches arranged in a region where the back alignment mark is formed are joined into one cavity by heat treatment, thereby forming the back alignment mark of an SON structure.

SUMMARY

According to an embodiment of the invention, a method of manufacturing a semiconductor device, includes forming a surface element structure and a predetermined mark separated from the surface element structure on a first main surface of a semiconductor substrate; forming a resist film on a second main surface of the semiconductor substrate; irradiating light having a wavelength in a predetermined wavelength region, the light being irradiated on the semiconductor substrate, from the second main surface of the semiconductor substrate, and detecting reflected light of the light by a detector disposed at a position opposing the second main surface of the semiconductor substrate, and identifying a position of the predetermined mark; performing alignment using the identified position of the predetermined mark as a reference, and transferring to the resist film and exposing a predetermined pattern corresponding to the surface element structure; and performing etching or ion-implantation of an impurity using the resist film as a mask, and forming a back element structure of the predetermined pattern on the second main surface of the semiconductor substrate. Forming the surface element structure and the predetermined mark includes forming a plurality of trenches that reach a predetermined depth from the first main surface of the semiconductor substrate, the plurality of trenches being formed in a layout by which two or more peaks are detected in each of a detected waveform in a first direction and a detected waveform in a second direction, of the reflected light, the first direction being parallel to the first main surface of the semiconductor substrate and the second direction being parallel to the first main surface of the semiconductor substrate and perpendicular to the first direction. A step formed on the first main surface of the semiconductor substrate by the plurality trenches constitutes the predetermined mark.

In the embodiment, the plurality of trenches are formed in a layout in which three or more of the plurality of trenches are disposed in the first direction, and three or more of the plurality of trenches are disposed in the second direction.

In the embodiment, a first trench and a second trench are formed as the plurality of trenches, the first trench being disposed in a cross-shaped layout and the second trench being disposed separated from the first trench, in a layout along the first trench and surrounding the first trench in a form of a cross.

In the embodiment, four trench segments having a straight planar shape are formed as the first trench, the four trench segments being disposed separated from each other in a cross-shaped layout having a center at a predetermined position and in which one end of each of the four trench segments is located at the center.

In the embodiment, forming the surface element structure and the predetermined mark includes embedding a polysilicon film in the trench.

In the embodiment, forming the surface element structure and the predetermined mark includes covering the predetermined mark by a metal film.

In the embodiment, the light is infrared light.

According to an embodiment of the invention, a method of manufacturing a semiconductor device, includes forming a surface element structure and a predetermined mark separated from the surface element structure on a first main surface of a semiconductor substrate; forming a resist film on a second main surface of the semiconductor substrate; irradiating light having a wavelength in a predetermined wavelength region, the light being irradiated on the semiconductor substrate, from the second main surface of the semiconductor substrate, and detecting reflected light of the light by a detector disposed at a position opposing the second main surface of the semiconductor substrate, and identifying a position of the predetermined mark; performing alignment using the identified position of the predetermined mark as a reference, and transferring to the resist film and exposing a predetermined pattern corresponding to the surface element structure; and performing etching or ion-implantation of an impurity using the resist film as a mask, and forming a back element structure of the predetermined pattern on the second main surface of the semiconductor substrate. Forming the surface element structure and the predetermined mark includes: forming on the first main surface of the semiconductor substrate, a stacked film constituted by an oxide film, a polysilicon film, and an interlayer insulating film that are sequentially stacked; and forming a groove that penetrates the stacked film in a depth direction. A step formed on the stacked film by the groove constitutes the predetermined mark.

In the embodiment, forming the surface element structure and the predetermined mark includes forming the groove to have a cross-shaped planar shape.

In the embodiment, forming the surface element structure and the predetermined mark includes forming the groove so that a portion of the stacked film remains having a cross-shaped planar shape and the groove surrounds the portion of the stacked film.

In the embodiment, forming the surface element structure and the predetermined mark includes covering the predetermined mark by a metal film.

In the embodiment, the light is infrared light.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 22 depicts detection results of back alignment marks according to a first example;

FIG. 23 depicts detection results of back alignment marks according to a second example;

FIG. 24 depicts a suitable range of a thickness of a semiconductor substrate according to a third example;

DESCRIPTION OF EMBODIMENTS

Figure 1:
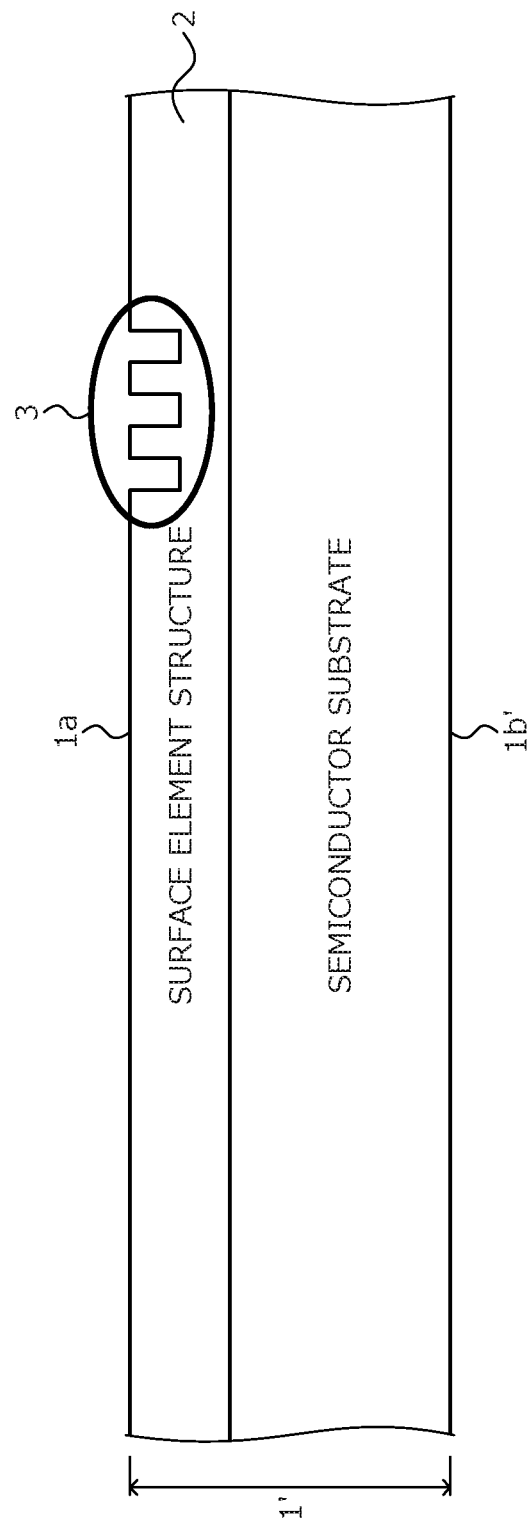
FIG. 1 is a cross-sectional view depicting a state of a semiconductor device according to a first embodiment during manufacture.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. In the description of the embodiments below and the accompanying drawings, main portions that are identical will be given the same reference numerals and will not be repeatedly described.

Figure 25:
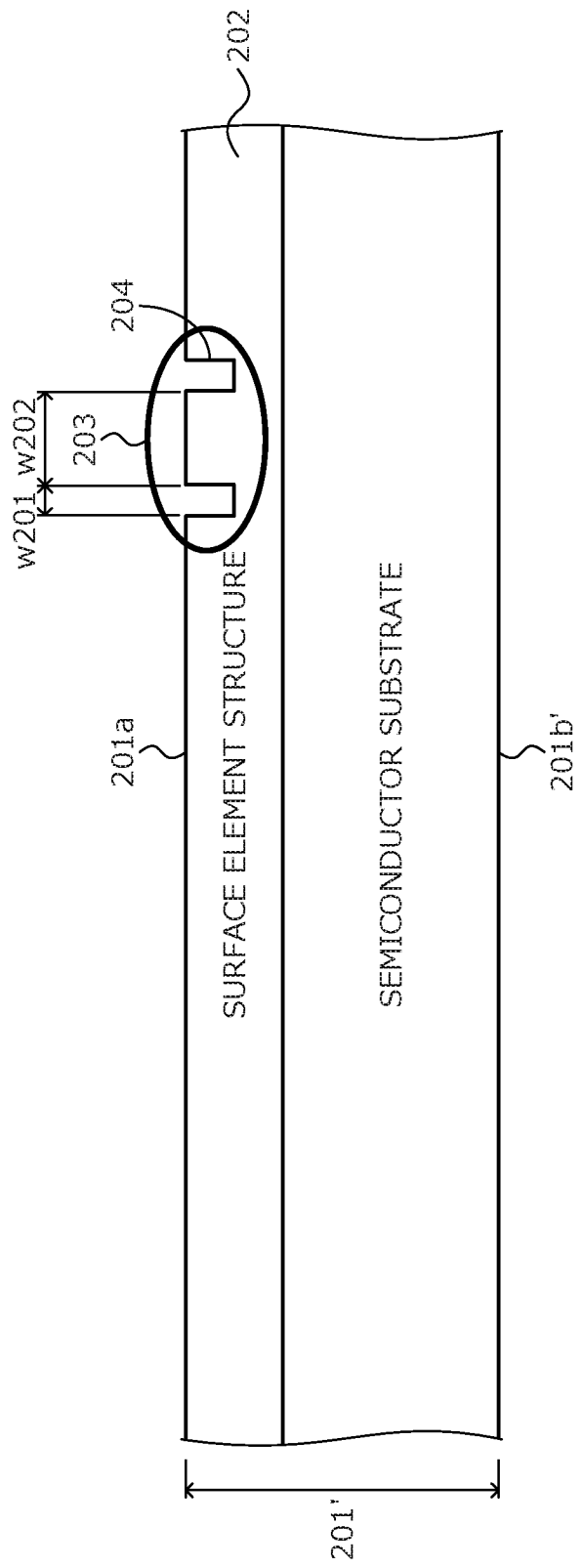
FIG. 25 is a cross-sectional view depicting a state of a semiconductor device according to a comparative example during manufacture.
Figure 26:
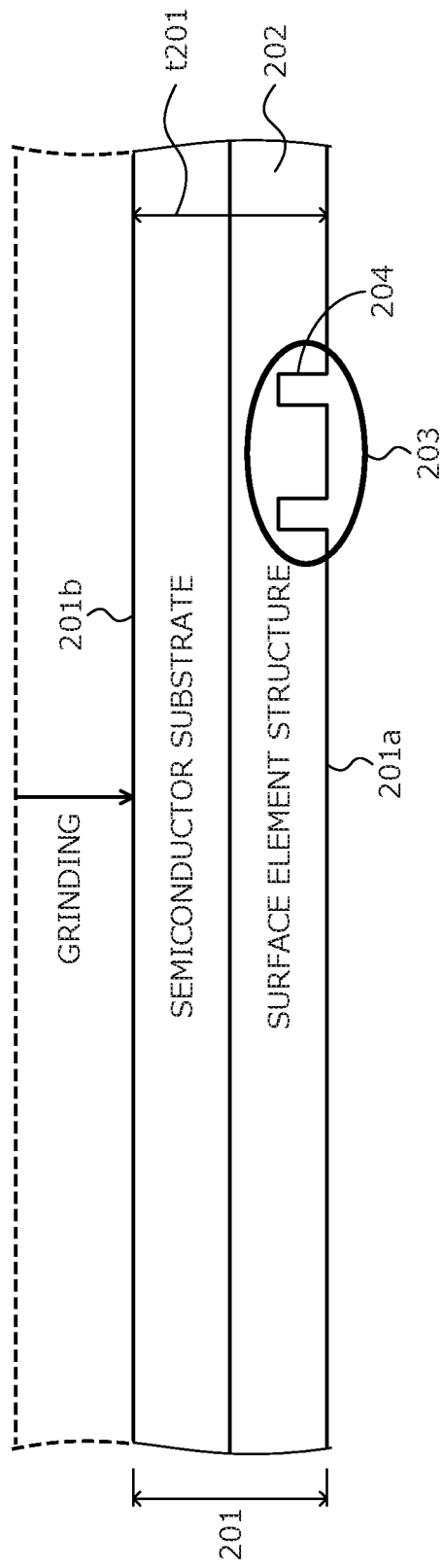
FIG. 26 is a cross-sectional view depicting a state of the semiconductor device according to the comparative example during manufacture.
Figure 27:
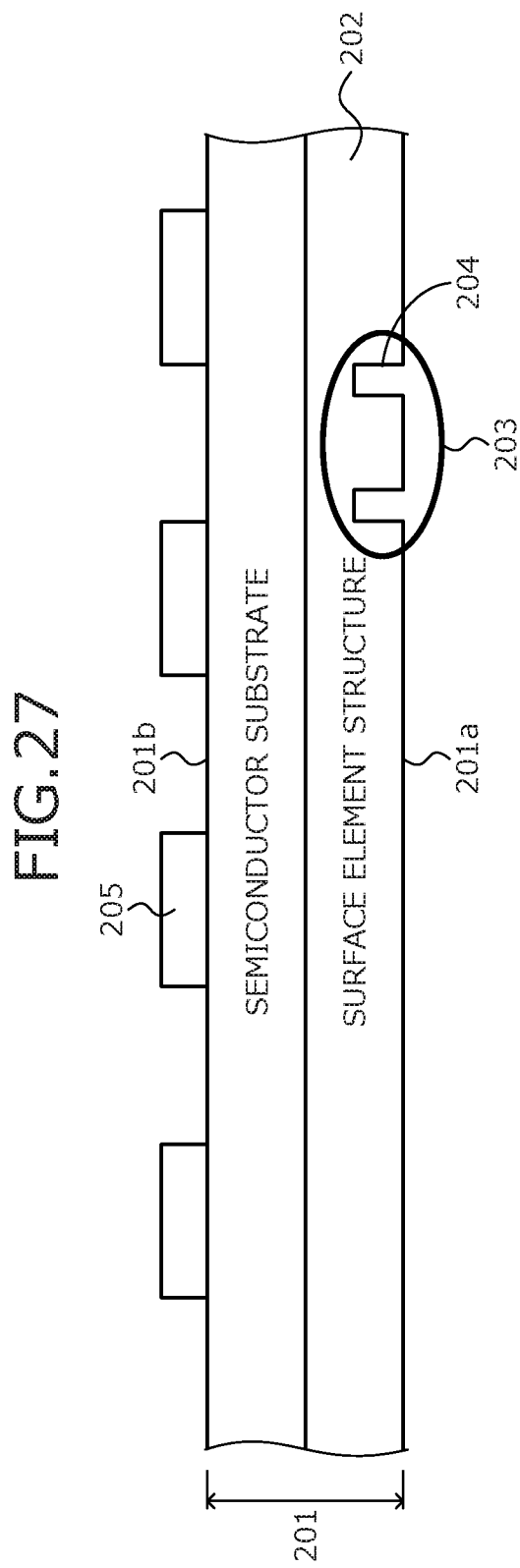
FIG. 27 is a cross-sectional view depicting a state of the semiconductor device according to the comparative example during manufacture.
Figure 28:
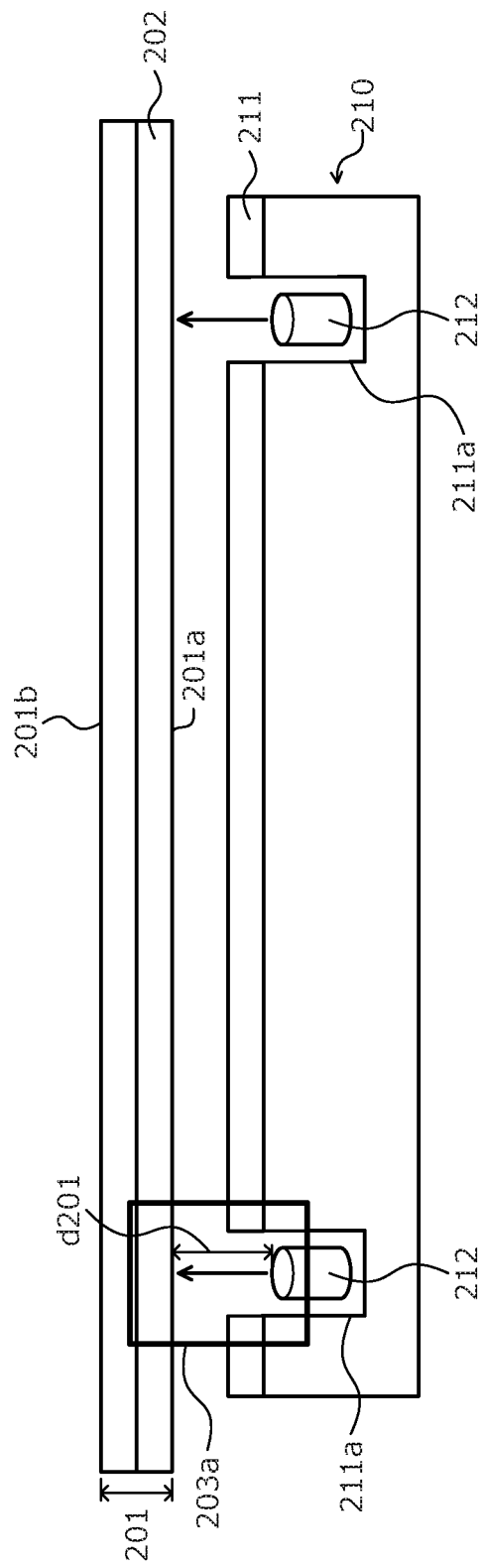
FIG. 28 is a cross-sectional view depicting an example of an alignment method according to the comparative example.
Figure 29:
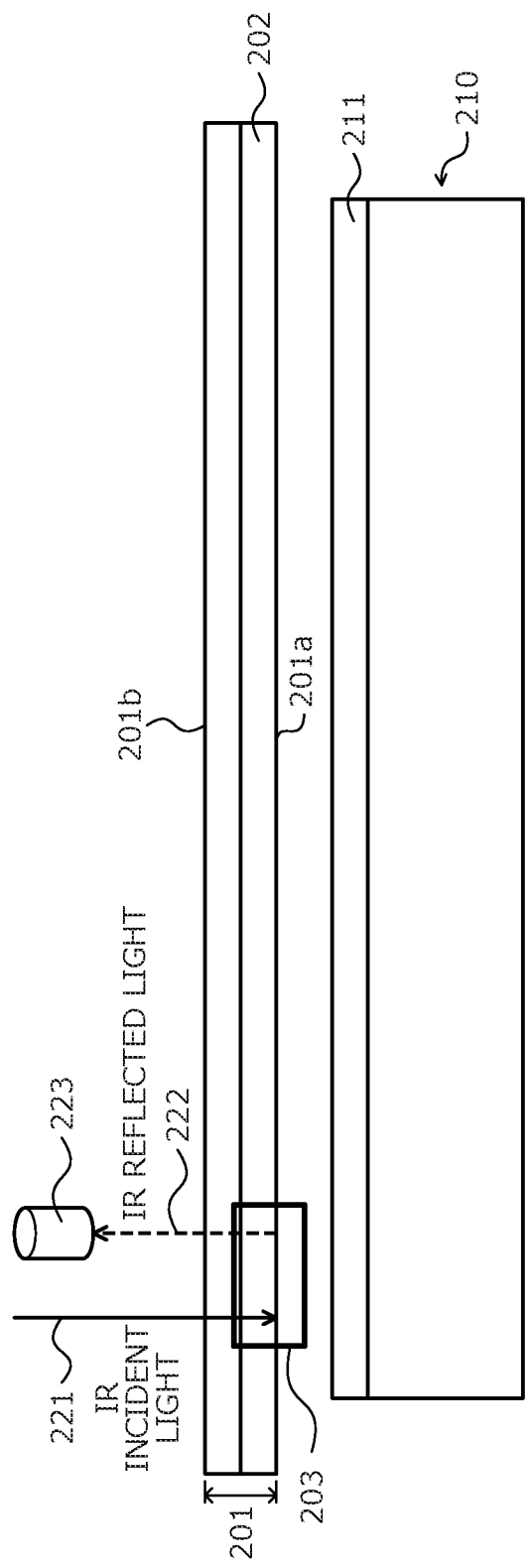
FIG. 29 is a cross-sectional view depicting an example of the alignment method according to the comparative example.
Figure 30:
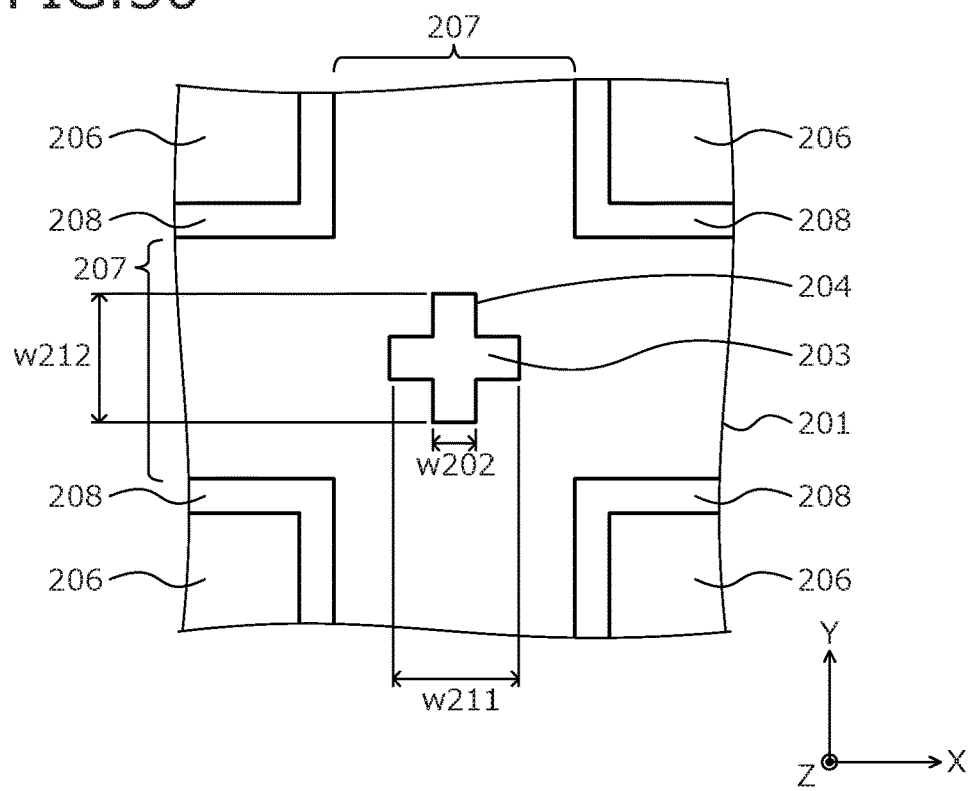
FIG. 30 is a plan view depicting a layout example of a back alignment mark of the comparative example, as viewed from a surface of a semiconductor substrate.

FIGS. 25, 26, and 27 are cross-sectional views each depicting a state of a semiconductor device according to a comparative example during manufacture. FIGS. 28 and 29 are cross-sectional views each depicting an example of an alignment method according to the comparative example. FIG. 30 is a plan view depicting a layout example of an alignment mark for a back (second main surface) of the comparative example, as viewed from a surface (first main surface) of a semiconductor substrate.

The alignment method according to the comparative example is described. First, a predetermined surface element structure 202 is formed on a surface 201a side of a semiconductor substrate 201'. At this time, a back alignment mark 203 constituted by a step formed by trenches 204 is formed at an arbitrary portion on the surface 201a of the semiconductor substrate 201' with the surface element structure 202, by a method identical to a method of forming an alignment mark used in ordinary patterning (patterning in which a main surface of a semiconductor substrate 201 having an alignment mark formed thereon and another main surface for which patterning is performed by using the alignment mark are the same main surface) (FIG. 25). In FIG. 25, the surface element structure 202 is simplified and depicted as a single layer (similarly in FIGS. 26 to 29).

Subsequently, the semiconductor substrate 201' is ground from the back 201b' side, thereby producing the semiconductor substrate 201 with a product thickness for use as a semiconductor device (FIG. 26). Next, a resist film 205 is formed on a back 201b of the semiconductor substrate 201 after grinding. Thereafter, by using an exposure device 210 capable of aligning a surface and a back of the semiconductor substrate 201 with each other, the back alignment mark 203 on the surface 201a of the semiconductor substrate 201 is detected, alignment is performed using the back alignment mark 203 as a reference, a predetermined mask pattern is exposed (transferred) on the resist film 205, and is developed. In this manner, the resist film 205 is patterned into a predetermined circuit pattern corresponding to the surface element structure 202 (FIG. 27). Processing such as etching or ion implantation is then performed by using the resist film 205 as a mask, thereby forming a back element structure (not depicted) on the back 201b of the semiconductor substrate 201 after grinding. Thereafter, the semiconductor substrate 201 is cut along a dicing line 207 to be separated into individual chips, thereby completing a semiconductor device.

As a method of detecting the back alignment mark 203 (not depicted in FIG. 28) formed on the surface 201a of the semiconductor substrate 201, there is known a method of detecting the back alignment mark 203 by using a camera (hereinafter, "back camera") 212 arranged at a position opposing the surface 201a of the semiconductor substrate 201 via an opening window 211a penetrating through a chuck stage 211 of the exposure device 210 (FIG. 28). FIG. 28 depicts a state where the back alignment mark 203 formed at a position 203a on the surface 201a of the semiconductor substrate 201 is captured by the back camera 212 with the upward arrow, where the position 203a opposes the back camera 212.

Further, as another method of detecting the back alignment mark 203 (not depicted in FIG. 29) formed on the surface 201a of the semiconductor substrate 201, there is known a method of using a detector 223 arranged at a position opposing the back 201b of the semiconductor substrate 201 to thereby measure reflection intensity of reflected light 222 of infrared (IR) light irradiated on the semiconductor substrate 201 from the back 201b, and detect the back alignment mark 203 based on the reflection intensity of the reflected light 222 (FIG. 29). In FIG. 29, the back alignment mark 203 is simplified, and a position at which the back alignment mark 203 is formed is surrounded by the rectangular frame. Reference sign 221 denotes incident infrared light.

In this manner, the back alignment mark 203 configured by a step formed by the trench 204, for example, on the dicing line 207 between effective regions (regions to serve as semiconductor chips) 206 of the semiconductor substrate 201, is detected by using the back camera 212 or the reflected light 222 of infrared light (FIG. 30). FIG. 30 depicts, with a straight line, the trench 204 that makes a portion of the semiconductor substrate 201 to have a cross-shaped planar shape. The back alignment mark 203 is configured by a step between a bottom of the trench 204 and a surface (the surface 201a) of the portion of the semiconductor substrate 201 having a cross-shaped planar shape encompassed by the trench 204. Reference sign 208 denotes a field oxide film formed along an outer periphery of the effective region 206.

However, the alignment described above using the back camera 212 (see FIG. 28) has a problem of low flexibility in terms of layout design because a position at which the back alignment mark 203 is formed on the semiconductor substrate 201 is limited to the position 203a of the back camera 212 of the exposure device 210. Further, the back camera 212 is fixed to the exposure device 210, and a distance d201 from the semiconductor substrate 201' cannot be changed. Therefore, the position and the shape of the back alignment mark 203 are measured at a low magnification by the back camera 212, resulting in low alignment accuracy.

Figure 32:
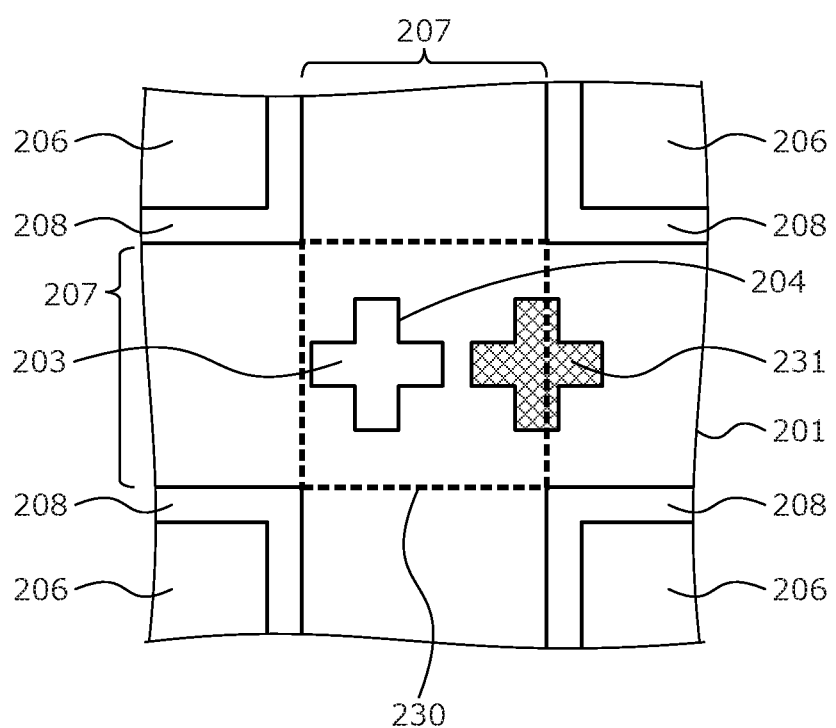
FIG. 32 is a plan view depicting a layout of a portion of the semiconductor substrate near the back alignment mark according to the comparative example, as viewed from a surface of the semiconductor substrate.

In detection of the back alignment mark 203 using the reflected light 222 of infrared light (see FIG. 29), there is a problem in that the detection accuracy of the back alignment mark 203 decreases in a case where a pattern around the back alignment mark 203 is dense (not depicted) or a case where another pattern 231 having a similar planar shape to the back alignment mark 203 is present near the back alignment mark 203 (FIG. 32). This problem may be solved by increasing the size of the back alignment mark 203 or widening a pattern-prohibited zone (a portion surrounded by the broken rectangular frame) 230 near the back alignment mark 203.

Figure 31:
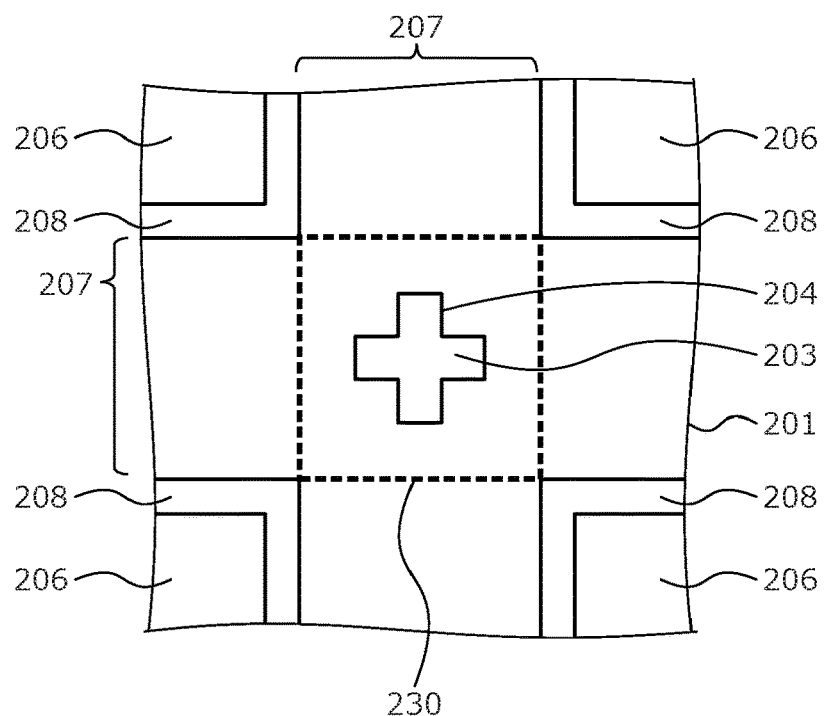
FIG. 31 is a plan view depicting a layout of a portion of a semiconductor substrate near the back alignment mark according to the comparative example, as viewed from a surface of the semiconductor substrate.

The pattern-prohibited zone 230 is a region where the other pattern 231 (a pattern other than the back alignment mark 203) is not arranged. FIGS. 31 and 32 are plan views depicting a layout of a portion of a semiconductor substrate near a back alignment mark according to a comparative example, as viewed from a surface of the semiconductor substrate. FIG. 31 depicts a state where the pattern-prohibited zone 230 near the back alignment mark 203 is widened. FIG. 32 depicts a state where the other pattern 231, which has a planar shape similar to the back alignment mark 203 and may be easily detected erroneously as the back alignment mark 203 by the detector 223, is present in the pattern-prohibited zone 230.

However, in both the case where the size of the back alignment mark 203 is increased and the case where the pattern-prohibited zone 230 near the back alignment mark 203 is widened, a surface area (an occupied area) of a region occupied by the back alignment mark 203 on the surface 201a of the semiconductor substrate 201 increases. Because the region occupied by the back alignment mark 203 is an ineffective region of the semiconductor substrate 201 in which no element structure is formed, there is a problem in that an increase of the occupied area causes reduction of the number of chips that may be cut from the semiconductor substrate 201 (the number of obtainable semiconductor chips).

A method of manufacturing a semiconductor device according to a first embodiment is described. FIGS. 1, 2, 3, and 4 are cross-sectional views depicting a state of a semiconductor device according to the first embodiment during manufacture. FIGS. 5, 7, 8, 10, and 11 are plan views depicting a layout example of an alignment mark for a back (second main surface) used in the method of manufacturing a semiconductor device according to the first embodiment as viewed from a surface (first main surface) of a semiconductor substrate. FIG. 6 is a cross-sectional view of a structure along cutting line A-A' in FIG. 5. FIG. 9 is a cross-sectional view of a structure along cutting line B-B' in FIG. 8. FIG. 12 is a cross-sectional view of a structure along cutting line C-C' in FIG. 11.

The method of manufacturing a semiconductor device according to the first embodiment includes performing with respect to a semiconductor substrate (semiconductor wafer) 1 having a surface (first main surface) 1a and a back (second main surface) 1b substantially parallel to each other, patterning (back patterning) of the back 1b of the semiconductor substrate 1 by using an alignment mark (back alignment mark: not depicted in FIG. 4) 3 formed on the surface 1a of the semiconductor substrate 1. The reflection intensity of reflected light 22, light that is in a predetermined wavelength region, irradiated on the semiconductor substrate 1 from the back 1b and reflected, is detected by using a detector 23 arranged at a position opposing the back 1b of the semiconductor substrate 1, so that the position of the back alignment mark 3 is identified. The light in the predetermined wavelength region irradiated on the semiconductor substrate 1 is infrared (IR) light, for example. In the following description, as an example, a case is explained where the position of the back alignment mark 3 is identified by using infrared light of an infrared microscope of a general exposure device 10.

In particular, first, a predetermined surface element structure 2 is formed on the surface 1a side of a semiconductor substrate 1', as depicted in FIG. 1. At this time, the back alignment mark 3 is formed at an arbitrary position on the surface 1a of the semiconductor substrate 1' by a method similar to a method of forming an alignment mark used in ordinary patterning. Alignment for forming the surface element structure 2 uses an alignment mark (not depicted) formed by the ordinary patterning. Ordinary patterning means patterning in which a main surface of the semiconductor substrate 1 having an alignment mark formed thereon and another main surface for which patterning is performed by using the alignment mark are the same main surface, and that is performed by visually recognizing the alignment mark from the main surface of the semiconductor substrate 1 on which the alignment mark is formed by means of a CCD (charge coupled device) camera or the like.

The back alignment mark 3 is configured by a step formed on the surface 1a of the semiconductor substrate 1'. In particular, the back alignment mark 3 may be configured by a step generated by a trench formed on the surface 1a of the semiconductor substrate 1' (a recessed portion: a difference in height between the surface 1a of the semiconductor substrate 1' and a bottom of the trench), for example. Alternatively, the back alignment mark 3 may be configured by a step generated by a groove formed in a stacked film (for example, a stacked film of a field oxide film, a polysilicon film, and an interlayer insulating film stacked in this order) on the surface 1a of the semiconductor substrate 1' (a recessed portion: a difference in height between a surface of the stacked film and the surface of the semiconductor substrate 1') or a step generated by a groove that encompasses a portion of the stacked film (a convex portion: a difference in height between a surface of the stacked film and the surface of the semiconductor substrate 1'). The back alignment mark 3 is formed simultaneously with respective portions of the surface element structure 2, for example. Details of the back alignment mark 3 are described later.

Figure 2:
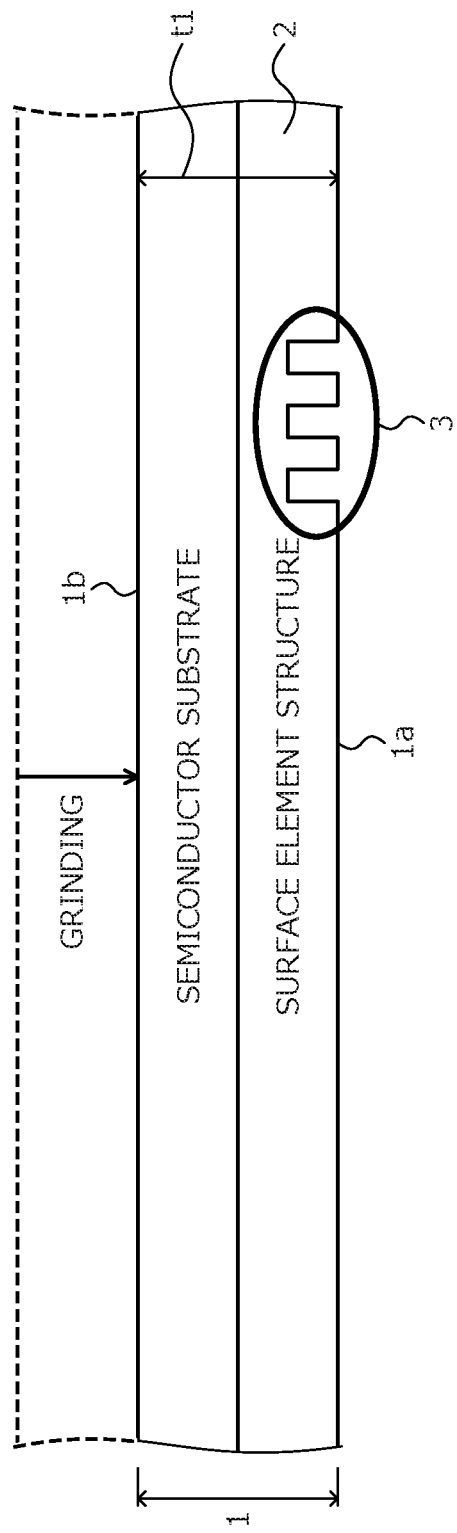
FIG. 2 is a cross-sectional view depicting a state of the semiconductor device according to the first embodiment during manufacture.
Figure 3:
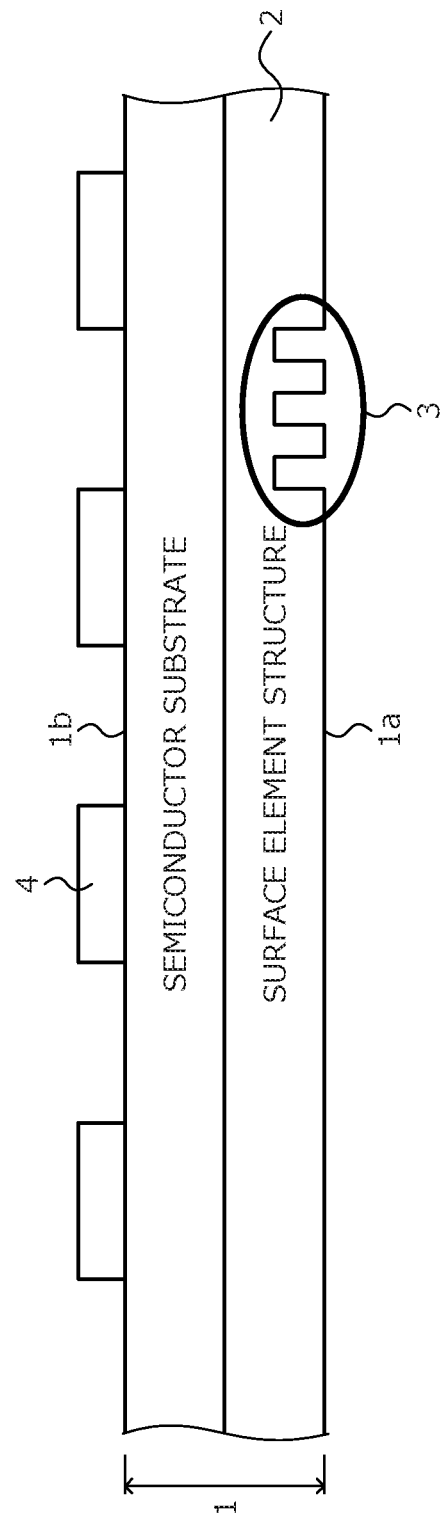
FIG. 3 is a cross-sectional view depicting a state of the semiconductor device according to the first embodiment during manufacture.
Figure 4:
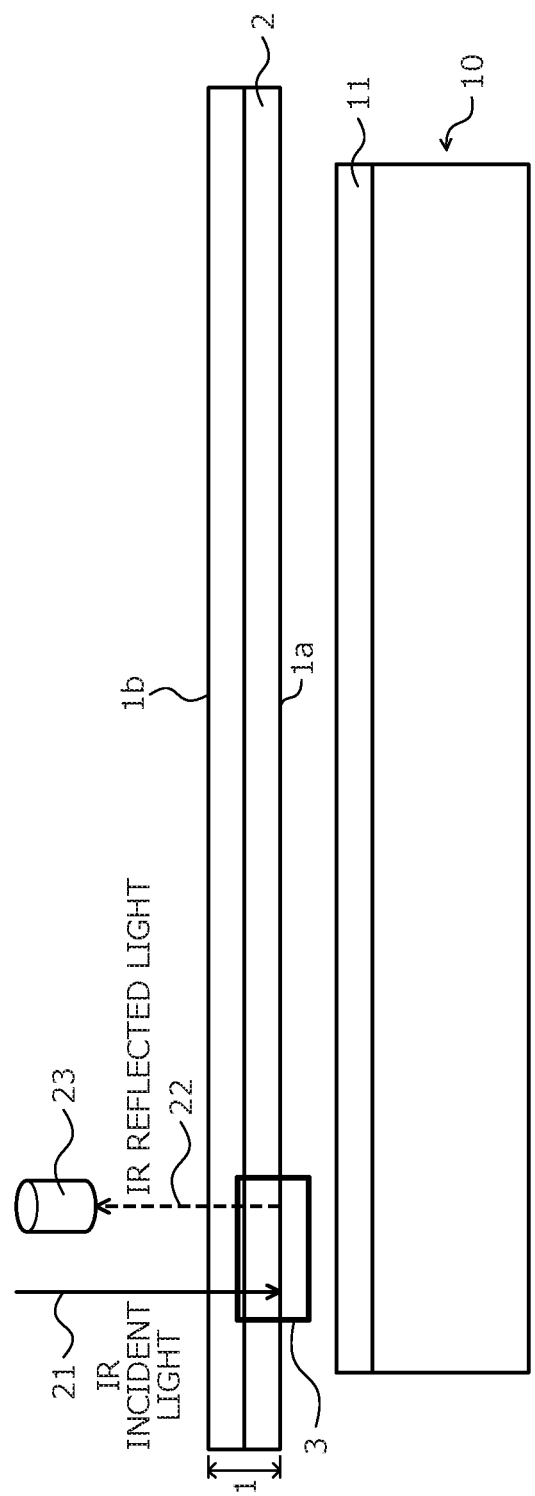
FIG. 4 is a cross-sectional view depicting a state of the semiconductor device according to the first embodiment during manufacture.

Next, as depicted in FIG. 2, the semiconductor substrate 1' is ground from the back 1b' side, thereby obtaining the semiconductor substrate 1 having a thickness t1 of a product that is used as a semiconductor device. Subsequently, as depicted in FIG. 3, resist is applied on the back 1b of the semiconductor substrate 1 after grinding, to form a resist film 4. Next, a predetermined mask pattern is exposed (transferred) on the resist film 4 by using a general exposure device (not depicted), and is developed. In this manner, the resist film 4 is patterned into a predetermined circuit pattern corresponding to the surface element structure 2 (back patterning). Alignment for transferring a predetermined mask pattern on the resist film 4 on the back 1b of the semiconductor substrate 1 is described with reference to FIG. 4. In FIG. 4, the back alignment mark 3 is simplified, and the position at which the back alignment mark 3 is formed is surrounded by the rectangular frame.

Alignment between a predetermined mask patter and the semiconductor substrate 1 for transferring the mask pattern on the resist film 4 on the back 1b of the semiconductor substrate 1 uses the back alignment mark 3 on the surface 1a of the semiconductor substrate 1. Therefore, the back alignment mark 3 on the surface 1a of the semiconductor substrate 1 is first detected by using an infrared microscope of the general exposure device 10. In particular, as depicted in FIG. 4, the semiconductor substrate 1 is placed on a chuck stage 11 of the general exposure device 10 configured to perform alignment between a surface and a back of the semiconductor substrate 1, while the surface 1a is positioned to be adjacent to the chuck stage 11.

The reflection intensity of the reflected light 22 of the infrared light irradiated on the semiconductor substrate 1 from the back 1b is then measured by the detector 23, and the back alignment mark 3 is detected based on the reflection intensity of the reflected light 22. The infrared light is laser light in an infrared wavelength region. The infrared light is irradiated at an output density (W (watt)/cm$^2$) such that the semiconductor substrate 1 is not heated. The method of detecting the back alignment mark 3 will be described later. The detector 23 is arranged above the chuck stage 11 with the semiconductor substrate 1 arranged therebetween and opposes the back 1b of the semiconductor substrate 1. In FIG. 4, the semiconductor substrate 1 is depicted to be separated from the chuck stage 11 for clarifying the paths of the incident light 21 and the reflected light 22 of infrared light. However, in practice, the semiconductor substrate 1 is placed with the surface 1a being in contact with the chuck stage 11.

The incident light 21 of the infrared light travels in the semiconductor substrate 1 from the back 1b towards the surface 1a. The reflected light 22 of the infrared light travels in the semiconductor substrate 1 from the surface 1a towards the back 1b. The detector 23 is arranged at a position opposing the back alignment mark 3 on the surface 1a of the semiconductor substrate 1 with the semiconductor substrate 1 sandwiched therebetween. The detector 23 is movable in a direction parallel to the back 1b of the semiconductor substrate 1. Therefore, flexibility in layout of the position at which the back alignment mark 3 is formed on the surface 1a of the semiconductor substrate 1 is high. The position at which the back alignment mark 3 is formed is in an ineffective region (a region that is not used as a semiconductor chip), such as a dicing line.

Alignment is performed using the back alignment mark 3 as a reference, a predetermined mask pattern is exposed on the resist film 4, and is developed. In this manner, the resist film 4 may be patterned into a predetermined circuit pattern corresponding to the surface element structure 2. Subsequently, processing such as etching or ion implantation is performed by using the resist film 4 as a mask, thereby forming a back element structure (not depicted) on the back 1b of the semiconductor substrate 1 after grinding. Thereafter, the semiconductor substrate 1 is diced (is cut) along dicing lines to be separated into individual chips, thereby completing a semiconductor device having a predetermined element structure.

Figure 5:
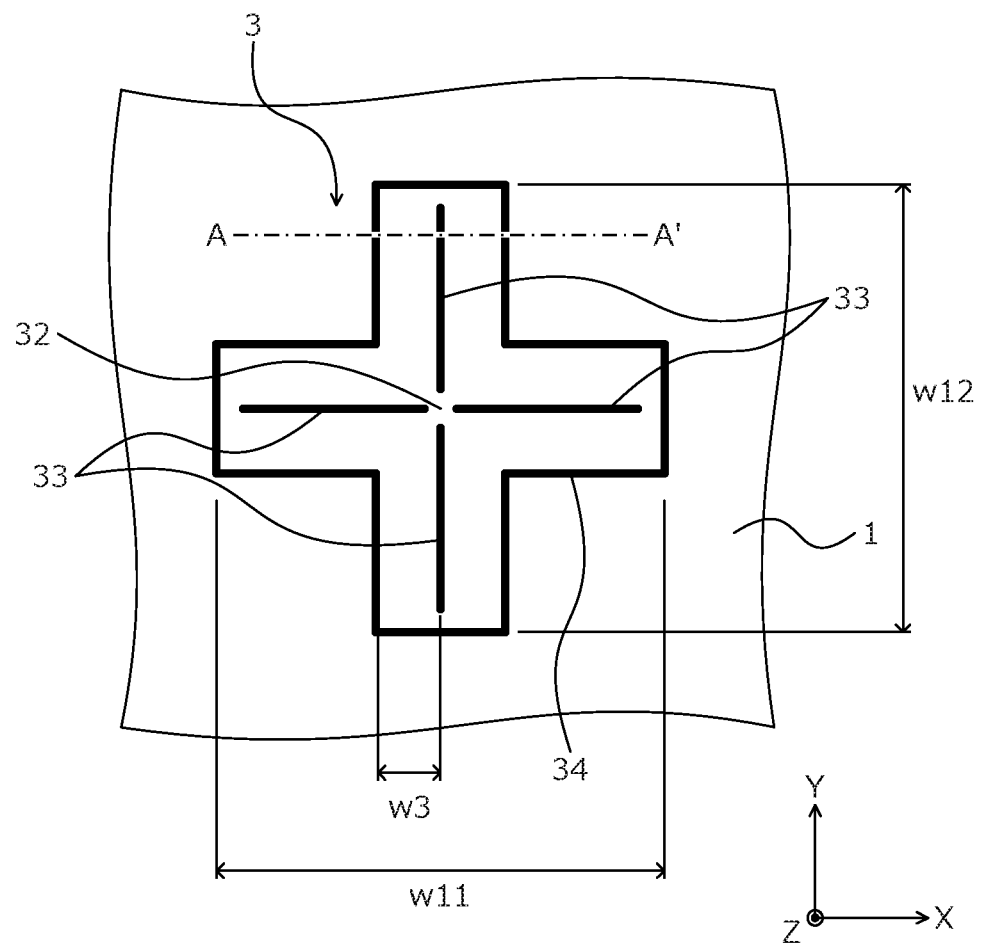
FIG. 5 is a plan view depicting a layout example of a back alignment mark used in a method of manufacturing a semiconductor device according to the first embodiment, as viewed from a surface of a semiconductor substrate.
Figure 6:
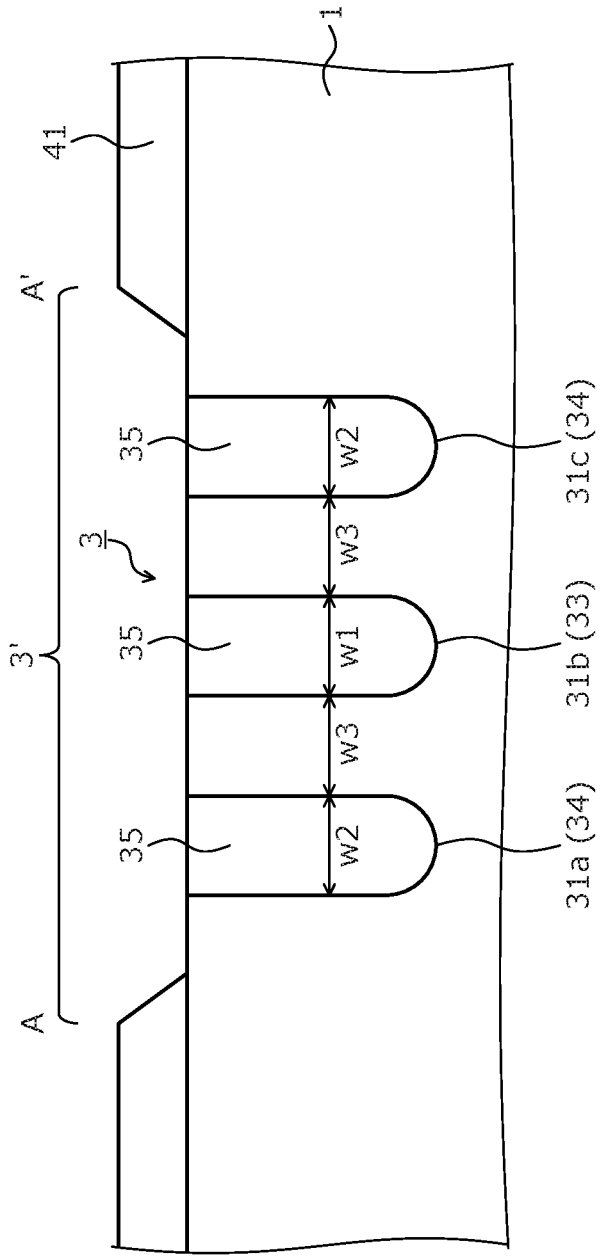
FIG. 6 is a cross-sectional view of a structure along cutting line A-A' in FIG. 5.

As depicted in FIGS. 5 and 6, the back alignment mark 3 is configured by using a step (a recessed portion) formed by the surface 1a of the semiconductor substrate 1 and a bottom of a trench formed at the surface 1a of the semiconductor substrate 1. The back alignment mark 3 has a planar shape in which three or more trenches are arranged along a direction parallel to the surface 1a of the semiconductor substrate 1. In particular, the back alignment mark 3 has a planar shape in which three trenches 31a to 31c are arranged along a direction parallel to the surface 1a of the semiconductor substrate 1, for example.

In this case, as viewed from the surface 1a side of the semiconductor substrate 1, for example, the back alignment mark 3 is configured by a trench (hereinafter, "first trench") 33 arranged in a cross-shaped layout and one trench (hereinafter, "second trench") 34 that is separated from the first trench 33 and is arranged along the first trench 33 to surround the first trench 33 in a cross-shaped layout. A polysilicon (poly-Si) film 35 is embedded in the first and second trenches 33 and 34.

For example, in a case where the surface element structure 2 is a trench gate structure, the first and second trenches 33 and 34 are formed simultaneously with a gate trench (a trench in which a gate electrode is embedded), and the polysilicon film 35 is formed simultaneously with the gate electrode. For example, the first trench 33 may be configured by four trench segments that have a linear planar shape and are arranged to be separated from each other in a cross-shaped layout having a center 32 at a predetermined position, where one end of each of the four trench segments is located at the center 32. That is, configuration may be such that the four trench segments configuring the first trench 33 and each having a straight planar shape are not in contact with each other at the center 32 of the cross-shaped layout. The reason therefor is described below.

In a case where the four trench segments that configure the first trench 33 and each have a straight planar shape are arranged to cross with each another at the center 32 of the cross-shaped layout, the width of the trench becomes wider at the center 32 than at other portions. Therefore, it is impossible to completely embed the first trench 33 with the polysilicon film 35 at the center 32 of the cross-shaped layout, whereby a cavity is generated in the polysilicon film 35. This generation of a cavity may lower the detection accuracy of the back alignment mark 3 by the reflected light 22 of infrared light. In a case of configuring the back alignment mark 3 by the first and second trenches 33 and 34 as described above, a center trench 31b of the three trenches 31a to 31c arranged in the direction parallel to the surface 1a of the semiconductor substrate 1 is configured by the first trench 33, and each of the trenches 31a and 31c on both sides is configured by the second trench 34.

For example, in a case where the back alignment mark 3 is formed on a dicing line of a width that is about a width of a cut by a dicing saw (for example, about 100 μm), maximum widths w11 and w12 (see FIG. 5) of the back alignment mark 3 in a first direction X and a second direction Y may be in a range from about 30 μm to 80 μm, for example. The first and second directions X and Y are parallel to the surface 1a of the semiconductor substrate 1 and are perpendicular to each other. That is, the back alignment mark 3 may have a size that is within a region having a surface area of about 80 square μm. Minimum widths w1 and w2 of the first and second trenches 33 and 34 (see FIG. 6) may be about a minimum value (for example, 0.3 μm) or more of criteria of stable machining of etching, such as 0.8 μm or more. A width (a mesa width) w3 between (a mesa region) the first and second trenches 33 and 34 may be six times larger than the minimum widths w1 and w2 of the first and second trenches 33 and 34 or more, and may be about 16 μm or less, for example.

Figure 7:
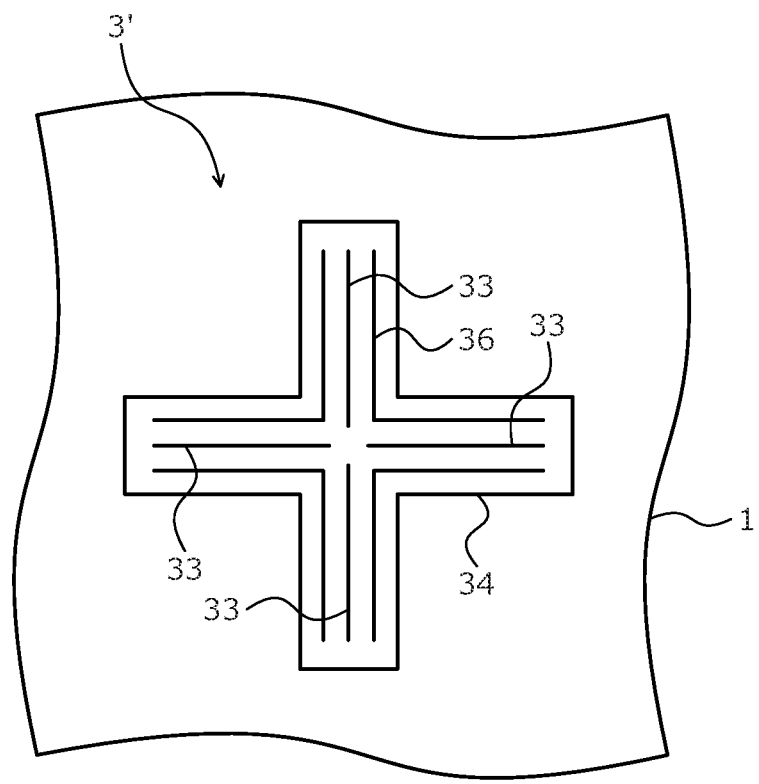
FIG. 7 is a plan view depicting a layout example of a back alignment mark used in the method of manufacturing a semiconductor device according to the first embodiment, as viewed from the surface of a semiconductor substrate.

As depicted in FIG. 7, a back alignment mark 3' may have a configuration in which five trenches are arranged along a direction parallel to a surface of the semiconductor substrate 1. In this case, it suffices that the back alignment mark 3' in FIG. 7 has a configuration in which a trench (hereinafter, "third trench") 36 is further arranged between the first and second trenches 33 and 34 of the back alignment mark 3 in FIGS. 5 and 6 and adjacent to each other (that is, between the trenches 31a and 31b and between the trenches 31b and 31c) to be separated from the first and second trenches 33 and 34. The third trench 36 is arranged in an L-shaped layout along the two first trenches 33 arranged to be substantially perpendicular to each other, for example, as viewed from the surface 1a side of the semiconductor substrate 1. The second trench 34 is, for example, arranged in a cross-shaped layout that surrounds the third trench 36 along the third trench 36 as viewed from the surface 1a side of the semiconductor substrate 1.

Figure 8:
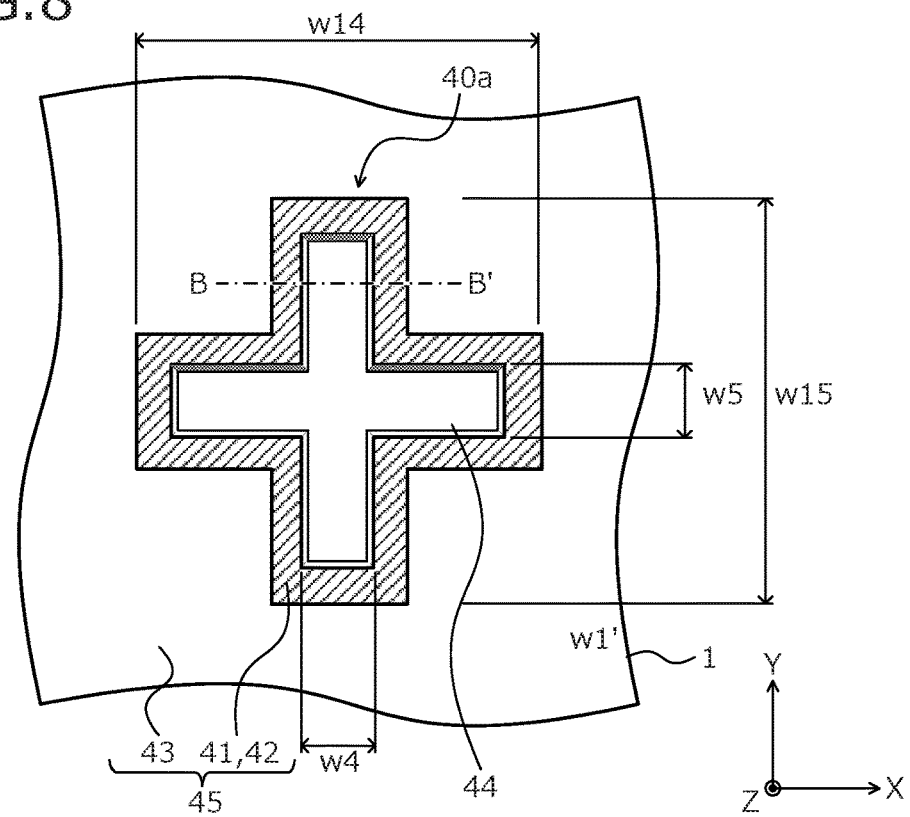
FIG. 8 is a plan view depicting a layout example of a back alignment mark used in the method of manufacturing a semiconductor device according to the first embodiment, as viewed from the surface of a semiconductor substrate.
Figure 9:
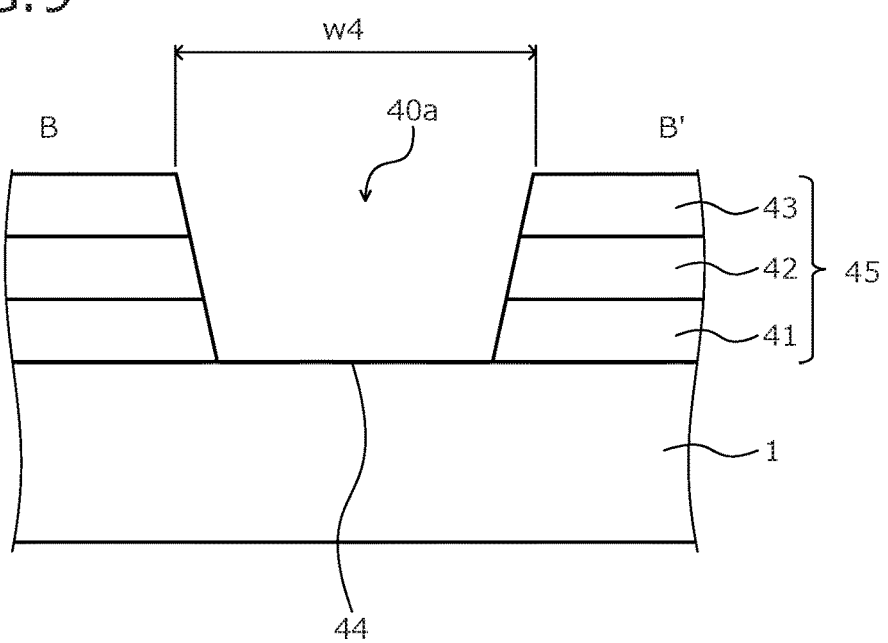
FIG. 9 is a cross-sectional view of a structure along cutting line B-B' in FIG. 8.

Further, as depicted in FIGS. 8 and 9, a back alignment mark 40a may be configured by using a step (a recessed portion) formed by a surface of a stacked film 45 on the surface 1a of the semiconductor substrate 1 and a bottom (the surface 1a of the semiconductor substrate 1) of a groove 44 penetrating through the stacked film 45 in a depth direction Z. The stacked film 45 is formed by stacking a field oxide film 41, a polysilicon film 42, and an interlayer insulating film 43 in this order, for example. The first oxide film 41 is an initial oxidation film, for example. The interlayer insulating film 43 is a BPSG (borophosphosilicate glass) film, for example. A depth direction Z is a direction from the surface 1a of the semiconductor substrate 1 towards the back 1b. The planar shape of the groove 44 may be a cross shape in which two straight portions parallel to the first and second directions X and Y, respectively, are arranged to cross with each other, for example.

As the number of stacked layers in the stacked film 45 with the groove 44 formed therein (penetrating therethrough) increases, the step formed by the groove 44 becomes larger. Therefore, a contrast (a difference between brightness and darkness) between the reflected light 22 of infrared light reflected by the bottom of the groove 44 (the surface 1a of the semiconductor substrate 1: an upper portion of the step as viewed from the back 1b side of the semiconductor substrate 1) and the reflected light 22 of infrared light reflected by a surface of the interlayer insulating film 43 (a lower portion of the step as viewed from the back 1b side of the semiconductor substrate 1) becomes larger, resulting in improvement of the detection accuracy of the back alignment mark 40a. The back alignment mark 40a has a cross-sectional shape that is concave (recessed) from the surface of the interlayer insulating film 43 towards the semiconductor substrate 1.

Figure 10:
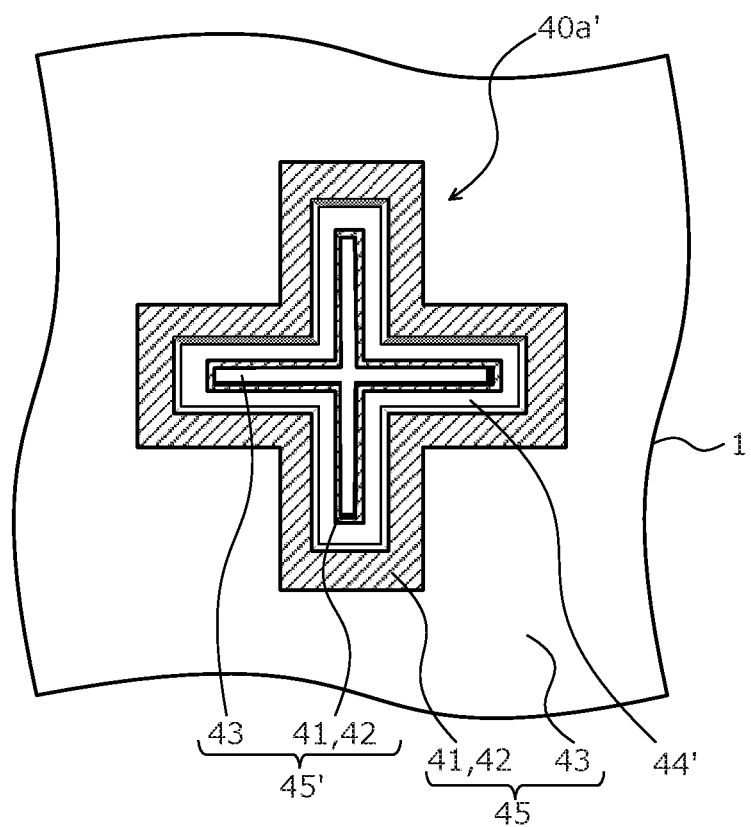
FIG. 10 is a plan view depicting a layout example of a back alignment mark used in the method of manufacturing a semiconductor device according to the first embodiment, as viewed from the surface of a semiconductor substrate.

A back alignment mark 40a' in FIG. 10 is different from the back alignment mark 40a in FIGS. 8 and 9 in that a stacked film 45' is selectively left in a groove 44' penetrating through the stacked film 45 (the field oxide film 41, the polysilicon film 42, and the interlayer insulating film 43) in the depth direction Z. The groove 44' surrounds the stacked film 45'. The stacked film 45' is a portion of the stacked film 45 separated by the groove 44'. That is, the back alignment mark 40a' in FIG. 10 is configured by using a step formed by a surface of the stacked films 45 and 45' and a bottom of the groove 44' (the surface 1a of the semiconductor substrate 1). The planar shape of the groove 44' may be a cross shape in which two straight portions that are each parallel to the first and second directions X and Y are arranged to cross with each other, for example. The planar shape of the stacked film 45' may be a cross shape in which two straight portions parallel to the first and second directions X and Y, respectively, are arranged to cross with each other, for example.

As the number of layers in the stacked film 45 having the groove 44' formed therein (penetrating therethrough) and the number of layers in the stacked film 45' left in the groove 44' increase, the step formed by the groove 44' becomes larger. Therefore, the contrast due to the reflected light 22 of infrared light becomes larger as in the back alignment mark 40a in FIGS. 8 and 9, thereby improving the detection accuracy of the back alignment mark 40a'. The planar shape of the stacked film 45' may be a cross-shaped, for example. The back alignment mark 40a' has a cross-sectional shape that protrudes at a center in a direction away from the surface 1a of the semiconductor substrate 1, and is recessed from a surface of the interlayer insulating film 43 towards the semiconductor substrate 1 in an outer peripheral portion (not depicted).

Figure 11:
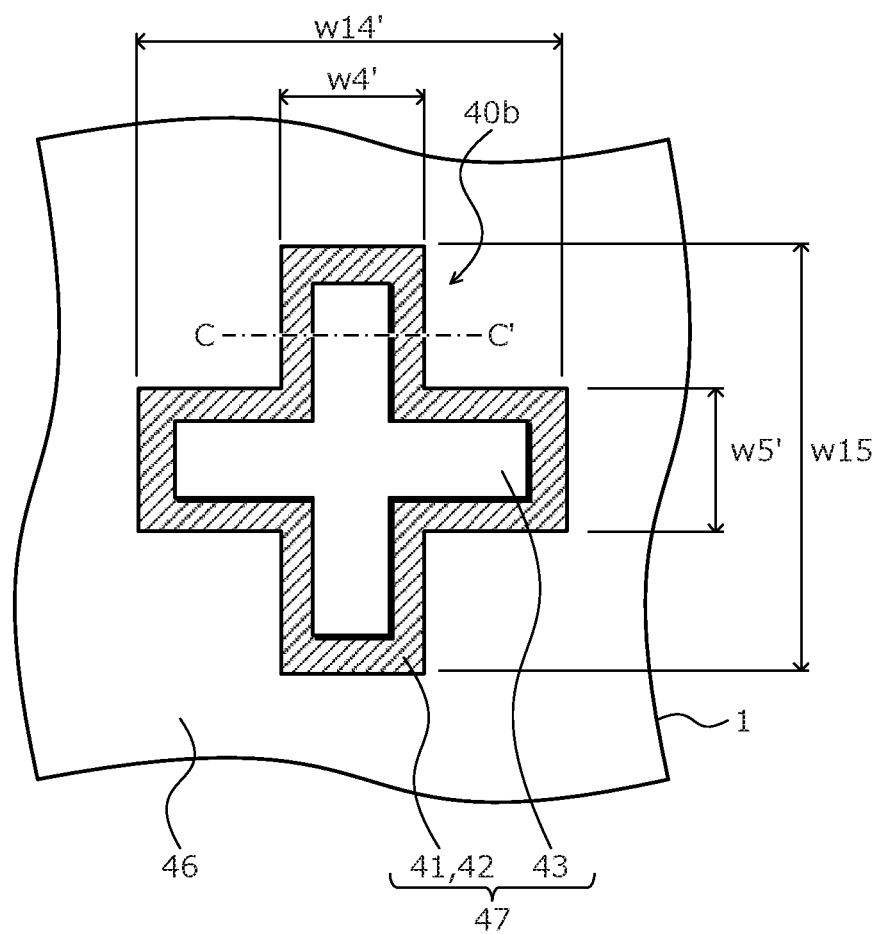
FIG. 11 is a plan view depicting a layout example of a back alignment mark used in the method of manufacturing a semiconductor device according to the first embodiment, as viewed from the surface of a semiconductor substrate.
Figure 12:
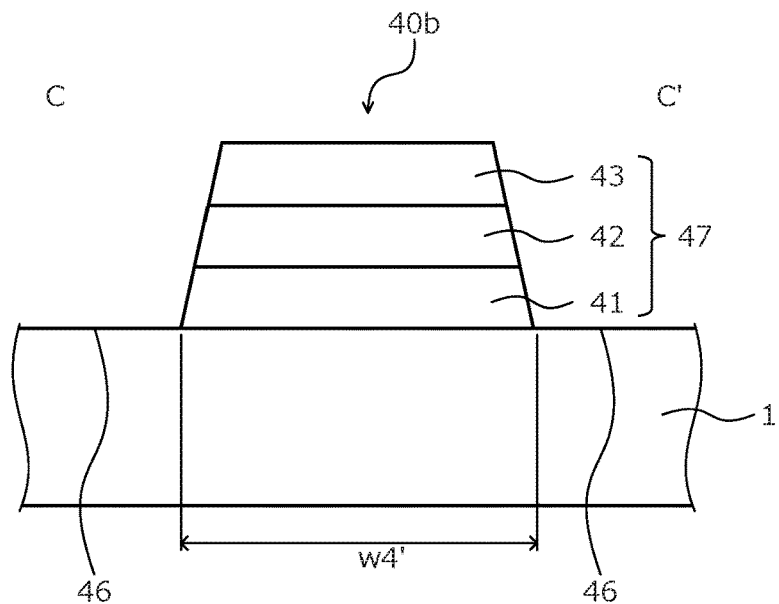
FIG. 12 is a cross-sectional view of a structure along cutting line C-C' in FIG. 11.

As depicted in FIGS. 11 and 12, a back alignment mark 40b may be configured by using a step formed by a bottom of a groove 46 (the surface 1a of the semiconductor substrate 1) and a surface of a stacked film 47 surrounded by the groove 46. The groove 46 penetrates the interlayer insulating film 43, the polysilicon film 42, and the field oxide film 41 in the depth direction Z. The stacked film 47 is a portion of the field oxide film 41, the polysilicon film 42, and the interlayer insulating film 43 that are separated by the groove 46.

That is, the back alignment mark 40b has a cross-sectional shape that protrudes in a direction away from the surface 1a of the semiconductor device 1. The planar shape of the stacked film 47 may be a cross shape in which two straight portions that are each parallel to the first and second directions X and Y are arranged to cross with each other, for example. As in the back alignment mark 40a in FIGS. 8 and 9, as the number of layers in the stacked film 47 increases, the step formed by the groove 46 becomes larger. Therefore, the contrast due to the reflected light 22 of infrared light becomes larger, thereby improving the detection accuracy of the back alignment mark 40b.

The back alignment marks 3, 3', 40a, 40a', and 40b are formed with the configurations described above. Therefore, when the back alignment mark 3, 3', 40a, 40a' or 40b formed on the surface 1a of the semiconductor substrate 1 is detected based on the reflection intensity of the reflected light 22 of infrared light irradiated from the back 1b of the semiconductor substrate 1, it is possible to improve the detection accuracy of the back alignment mark 3, 3', 40a, 40a', or 40b.

As described above, according to the first embodiment, a back alignment mark is formed by a step. The step is formed by a plurality trenches arranged in a layout in which three or more trenches are arranged in each of the first direction and the second direction in a surface of a semiconductor substrate, or is formed by a groove that penetrates a stacked film stacked on the surface of the semiconductor substrate in a depth direction. Therefore, it is possible to improve the detection accuracy of the back alignment mark on the surface of the semiconductor substrate by reflected light of infrared light irradiated from a back of the semiconductor substrate by using an infrared microscope of a general exposure device. Accordingly, it is possible to improve alignment accuracy.

Further, according to the first embodiment, due to the improvement of the detection accuracy of the back alignment mark, it is possible to detect the back alignment mark without increasing the size of the back alignment mark or widening a region (pattern-prohibited zone) in which a pattern other than the back alignment mark is not arranged. Therefore, it is possible to maintain the number of chips (the number of obtainable chips) that can be cut from the semiconductor substrate (semiconductor wafer). Furthermore, according to the first embodiment, because the back alignment mark is detected by infrared light, the position at which the back alignment mark is formed is not limited to any specific position. Therefore, flexibility in layout design is high.

Figure 13:
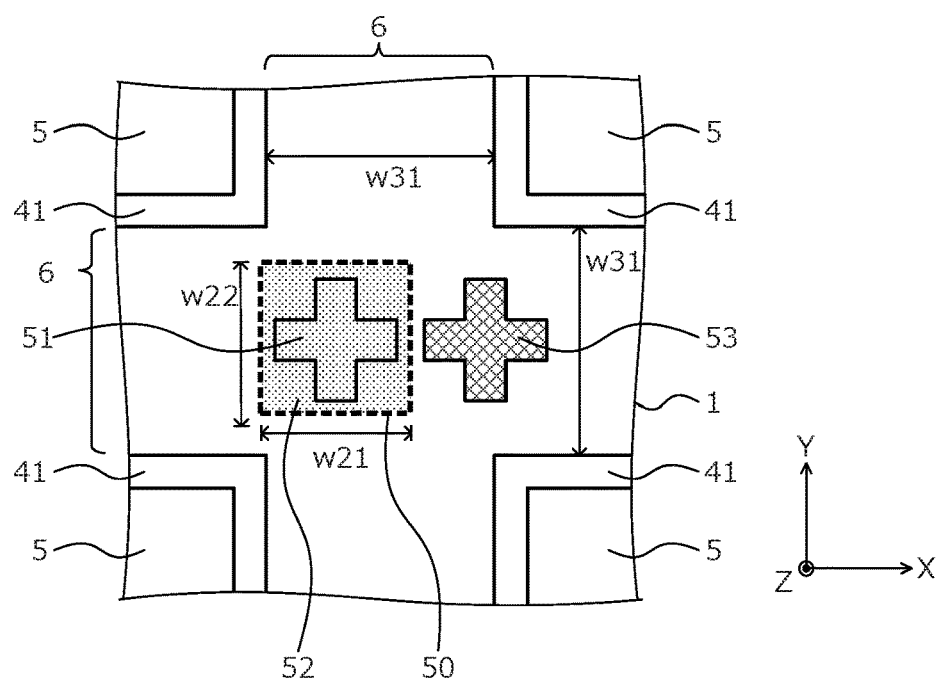
FIG. 13 is a plan view depicting a layout example of a back alignment mark used in a method of manufacturing a semiconductor device according to a second embodiment, as viewed from a surface of a semiconductor substrate.

Next, a structure of a semiconductor device according to a second embodiment is described. FIG. 13 is a plan view depicting a layout example of a back alignment mark used in a method of manufacturing a semiconductor device according to the second embodiment, as viewed from a surface of a semiconductor substrate. In FIG. 13, reference sign 5 denotes an effective region (a region to serve as a semiconductor chip) of the semiconductor substrate 1 surrounded by the field oxide film 41. The method of manufacturing a semiconductor device according to the second embodiment differs from the method of manufacturing a semiconductor device according to the first embodiment in that a metal film 52 is provided on the surface 1a of the semiconductor substrate 1 so as to cover a back alignment mark 51.

The back alignment mark 51 is any of the back alignment marks 3, 3', 40a, 40a', and 40b (FIGS. 5 to 12) according to the first embodiment. The maximum widths w11 and w12 of the back alignment mark 51 in the first and second directions X and Y may be about 70 μm or less, for example. The metal film 52 has a rectangular planar shape, for example. The minimum values of lengths of two sides of the metal film 52 that share one apex are the maximum widths w11 and w12 of the back alignment mark 51 in the first and second directions X and Y, respectively. The widths w21 and w22 of the metal film 52 in the first and second directions X and Y are the maximum widths w11 and w12 of the back alignment mark 51 in the first and second directions X and Y or more and are narrower than a width w31 of a dicing line 6.

The metal material of the metal film 52 may be variously changed. In particular, the metal film 52 may be formed by leaving a portion of a metal film deposited (formed) on the surface 1a of the semiconductor substrate 1 in order to form a surface electrode (for example, an emitter electrode 68 described later see FIG. 16), on a surface of the back alignment mark 51. That is, the metal material of the metal film 52 may be the same metal material as the surface electrode, specifically, aluminum (Al) or an aluminum alloy containing aluminum such as aluminum-silicon (Al—Si), for example.

Figure 14:
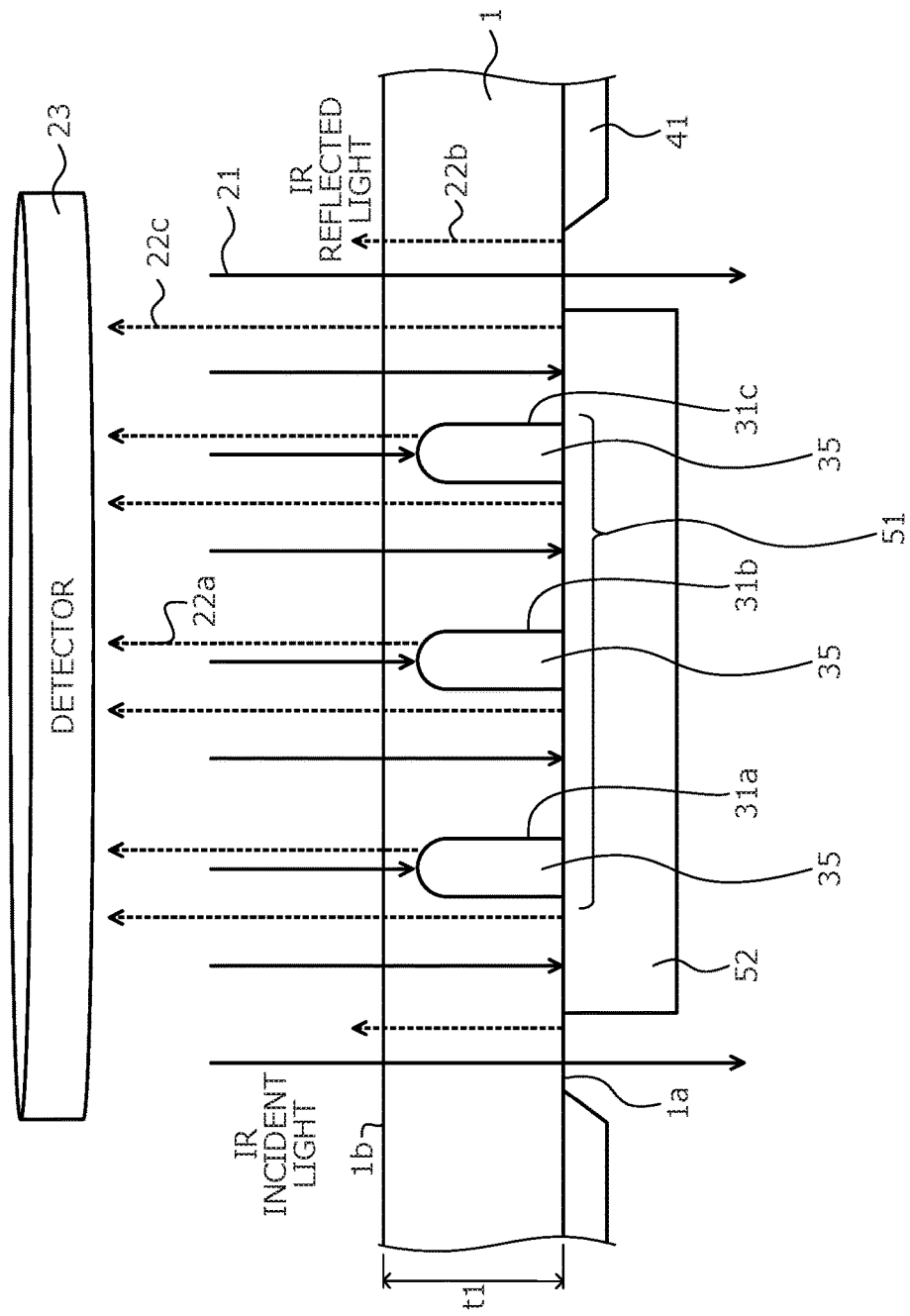
FIG. 14 is a cross-sectional view depicting a state of the semiconductor device according to the second embodiment during manufacture.
Figure 15:
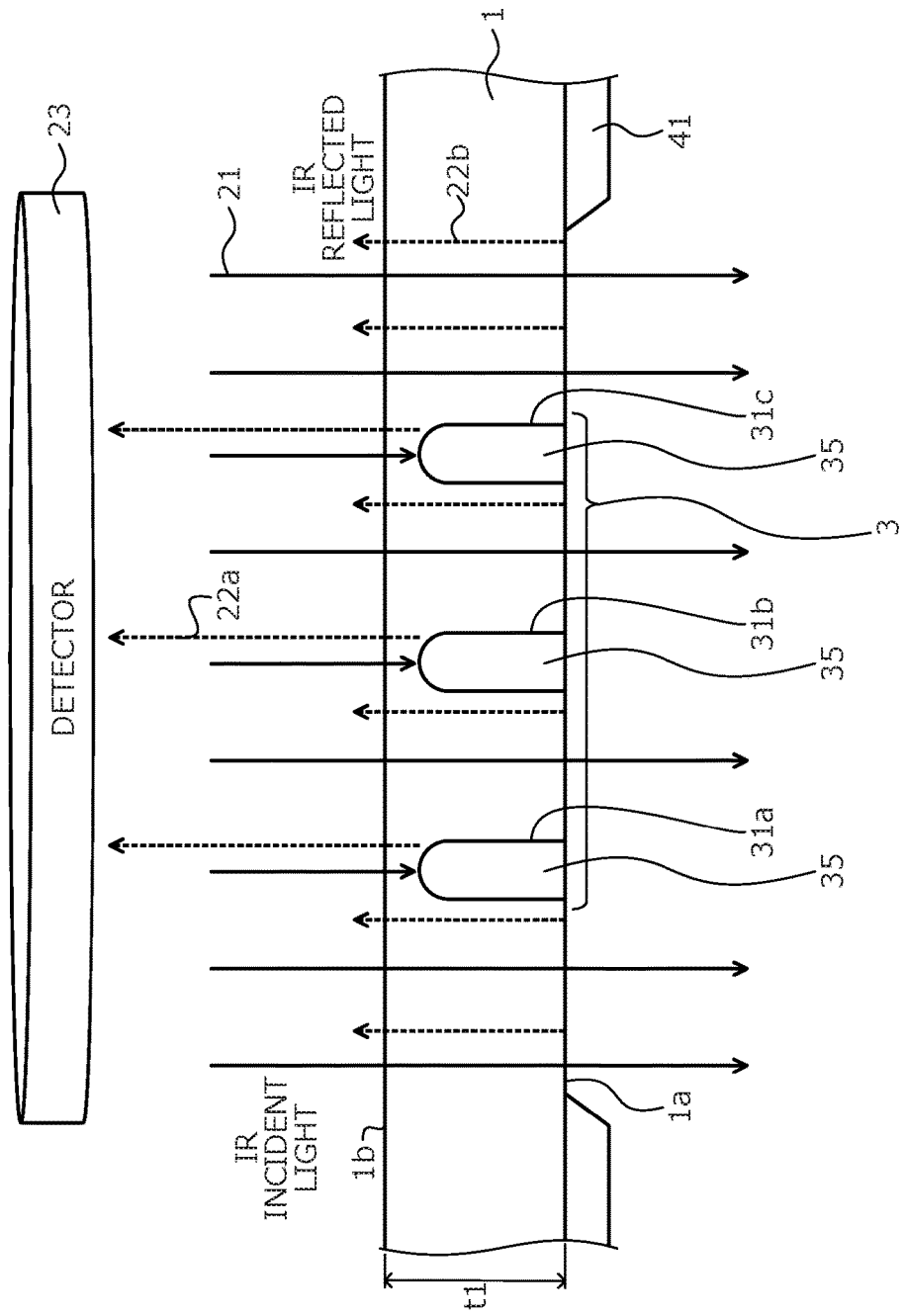
FIG. 15 is an enlarged cross-sectional view depicting a portion around the back alignment mark in FIG. 4.

In the method of manufacturing a semiconductor device according to the second embodiment, it suffices that the surface of the back alignment mark 51 is covered by the metal film 52 after formation of the back alignment mark 51 and before back patterning in the method of manufacturing a semiconductor device according to the first embodiment. FIG. 14 is a cross-sectional view depicting a state of the semiconductor device according to the second embodiment during manufacture. FIG. 14 is an example where the back alignment mark 51 is the back alignment mark 3 in FIGS. 5 and 6. FIG. 15 is an enlarged cross-sectional view depicting a portion around the back alignment mark in FIG. 4.

As depicted in FIGS. 14 and 15, in alignment for back patterning, as described above, infrared light is irradiated from the back 1b of the semiconductor substrate 1 to the semiconductor substrate 1, substantially perpendicularly to the back 1b of the semiconductor substrate 1. The incident light 21 of infrared light is not transmitted through the polysilicon film 35 in the trenches 31a to 31c and is reflected at bottom portions of the trenches 31a to 31c. Reflected light 22a of infrared light having been reflected at the bottom portions of the trenches 31a to 31c, travels from the back 1b of the semiconductor substrate 1 to outside of the semiconductor substrate 1, substantially perpendicularly to the back 1b of the semiconductor substrate 1, and is detected by the detector 23 opposing the back 1b of the semiconductor substrate 1.

In a case where the back alignment mark 3 is not covered by the metal film 52 as depicted in FIG. 15, in a portion other than the portions at which the trenches 31a to 31c are arranged, the incident light 21 of infrared light irradiated on the semiconductor substrate 1 from the back 1b of the semiconductor substrate 1 travels through the semiconductor substrate 1 and exits from the surface 1a of the semiconductor substrate 1 to the outside substantially perpendicularly to the surface 1a of the semiconductor substrate 1. Therefore, the reflection intensity of reflected light 22b of infrared light irradiated on the portion other than the portions at which the trenches 31a to 31c are arranged becomes lower as the thickness t1 of the semiconductor substrate 1 is increased, and the reflected light 22b is difficult to be detected by the detector 23 opposing the back 1b of the semiconductor substrate 1.

Meanwhile, in a case where the back alignment mark 51 is covered by the metal film 52 as depicted in FIG. 14, the incident light 21 of infrared light that has traveled through the semiconductor substrate 1 from the back 1b of the semiconductor substrate 1 and reached the surface 1a of the semiconductor substrate 1 does not pass through the metal film 52, and the incident light 21 is therefore reflected by the metal film 52 (an interface between the metal film 52 and the semiconductor substrate 1). Therefore, reflected light 22c of infrared light reflected by the metal film 52 has a small decrease in reflection intensity, and travels from the back 1b of the semiconductor substrate 1 to the outside of the semiconductor substrate 1 substantially perpendicularly to the back 1b of the semiconductor substrate 1, enabling the reflected light 22c to be easily detected by the detector 23 opposing the back 1b of the semiconductor substrate 1.

Accordingly, by covering the back alignment mark 51 by the metal film 52, as compared to a case where the metal film 52 is not provided, it is possible to improve the detection accuracy of the back alignment mark 51 by the reflected light 22 of infrared light. Further, as compared to the case where the metal film 52 is not provided, because the incident light 21 of infrared light that has traveled in the semiconductor substrate 1 from the back 1b of the semiconductor substrate 1 and reached the surface 1a of the semiconductor substrate 1 may be surely reflected by the metal film 52, the thickness t1 of the semiconductor substrate 1 may be increased. In particular, in a case where the semiconductor substrate 1 is a silicon substrate, an upper limit of the thickness t1 of the semiconductor substrate 1 is about 400 µm, for example.

Further, because of the improvement of the detection accuracy of the back alignment mark 51, it is possible to make a surface area of a pattern-prohibited zone 50 (a portion surrounded by the broken rectangular frame in FIG. 13) smaller than that in the configuration of the comparative example (FIGS. 31 and 32). In particular, the surface area of the pattern-prohibited zone 50 may be reduced to substantially the same surface area as the metal film 52 (=width w21×width w22), for example. Therefore, another pattern (for example, a pattern having a similar planar shape to that of the back alignment mark 51) 53 that may be easily detected erroneously as the back alignment mark 51 by the detector 23 is not arranged in the pattern-prohibited zone 50.

The back alignment mark 51 may have the same configuration as the back alignment mark 203 of the comparative example (see FIG. 31). Even when the back alignment mark 51 has the same configuration as the back alignment mark 203 of the comparative example, it is possible to improve the detection accuracy of the back alignment mark 51 by covering the back alignment mark 51 by the metal film 52.

As described above, according to the second embodiment, it is possible to obtain effects identical to those in the first embodiment. Further, according to the second embodiment, a metal film is provided on a surface of a semiconductor substrate so as to cover a back alignment mark. Therefore, the metal film covering the back alignment mark on the surface of the semiconductor substrate makes it is possible to reflect incident light of infrared light that has been irradiated on the semiconductor substrate from the back of the semiconductor substrate and that has traveled in the semiconductor substrate and reached a surface of the semiconductor substrate. Accordingly, the decrease of the reflection intensity of reflected light of infrared light is smaller than that in the case where the back alignment mark is not covered by the metal film, thereby enabling improvement of the detection accuracy of the back alignment mark.

Further, according to the second embodiment, the back alignment mark alone that is to be measured may be detected by the reflected light of infrared light, without increasing the size of the back alignment mark or widening a region (pattern-prohibited zone) in which a pattern other than the back alignment mark is not arranged.

Figure 16:
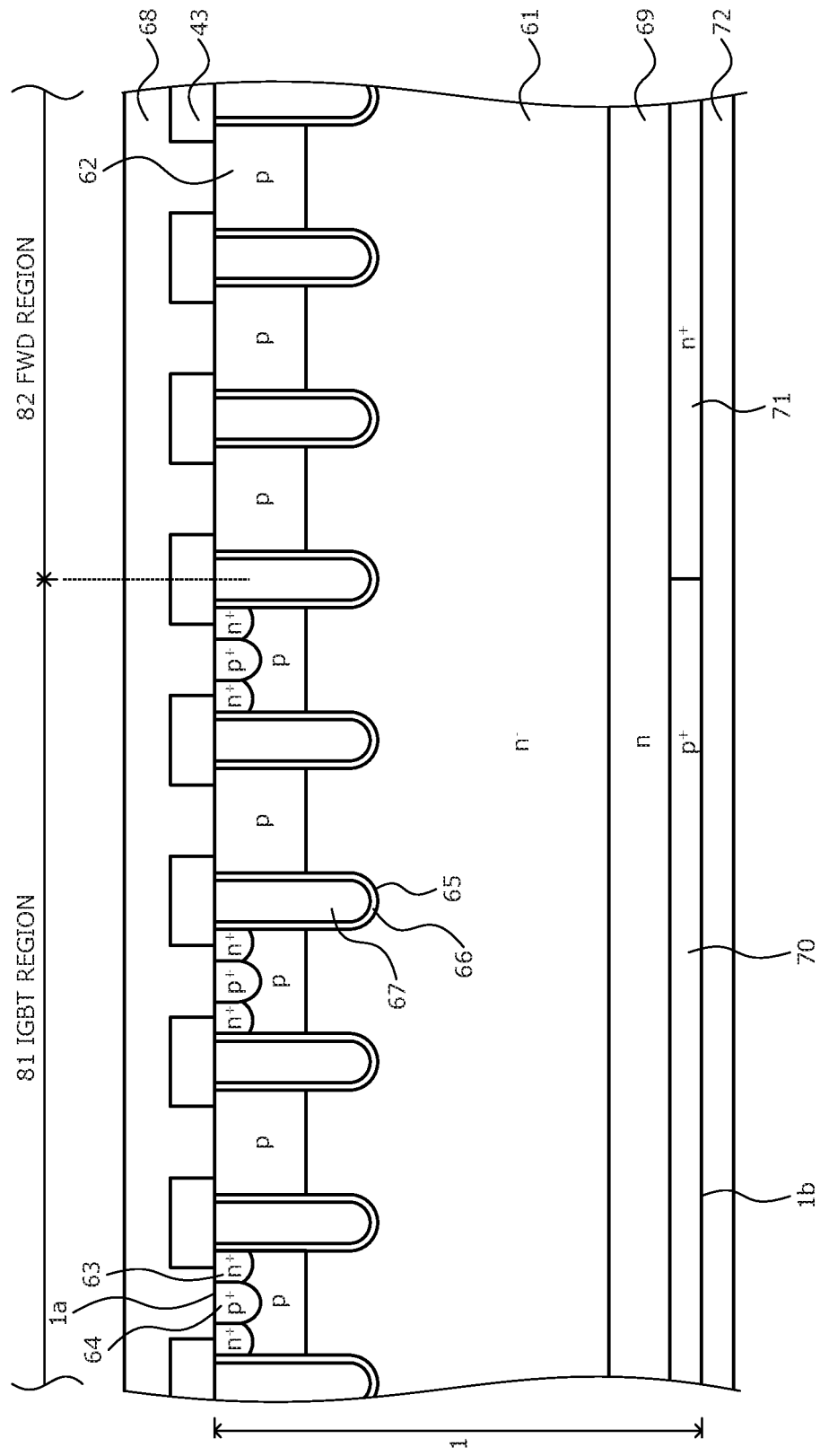
FIG. 16 is a cross-sectional view depicting a structure of the semiconductor device according to a third embodiment.

Next, as a semiconductor device according to a third embodiment, a structure example of a semiconductor device manufactured by the method of manufacturing a semiconductor device according to the first or second embodiment is described. FIG. 16 is a cross-sectional view depicting a structure of the semiconductor device according to the third embodiment.

The semiconductor device according to the third embodiment depicted in FIG. 16 is a reverse conducting IGBT (insulated gate bipolar transistor) (RC-IGBT) in which an IGBT having a trench gate structure and an FWD (free wheeling diode) connected in anti-parallel to the IGBT are integrated on the same semiconductor substrate (semiconductor chip) 1.

On the same $n^-$-type semiconductor substrate 1, an IGBT region 81 and an FWD region 82 are provided in an active region in parallel in a direction parallel to the surface 1a of the semiconductor substrate 1. The IGBT region 81 is a region where the IGBT is arranged and that serves as an operation region of the IGBT. The FWD region 82 is a region where the FWD is arranged and that serves as an operation region of the FWD. The active region is a region where a principal current flows in an on-state.

FIG. 16 depicts only an active region, and illustrations of an edge termination region surrounding the active region are omitted. The edge termination region is a region between the active region and a side face of the semiconductor substrate 1, and is a region of an n-type drift region 61 for realizing electric field relaxation on a chip-surface side and maintaining a breakdown voltage. The breakdown voltage is a voltage limit when malfunction or breakdown of an element does not occur. A breakdown-voltage structure such as a guard ring or a field plate may be provided in the edge termination region.

A p-type base region 62 of an IGBT is provided in a surface layer of the surface 1a of the semiconductor substrate 1. The p-type base region 62 is provided in the active region overall spanning the IGBT region 81 and the FWD region 82. The p-type base region 62 serves as a p-type anode region in the FWD region 82. Inside the p-type region 62, an $n^+$-type emitter region 63 and a $p^+$-type contact region 64 are selectively provided only in the IGBT region 81.

It suffices that the $n^+$-type emitter region 63 is arranged in at least one mesa region between adjacent gate trenches 65 (in mesa regions) described later, and a mesa region in which the $n^+$-type emitter region 63 is not arranged may be present. A portion of the semiconductor substrate 1 other than the p-type base region 62 and an n-type field stop (FS) region 69, a $p^+$-type collector region 70, and an $n^+$-type cathode region 71 described later is the $n^-$-type drift region 61.

The gate trenches 65 are provided from the surface 1a of the semiconductor substrate 1 in the depth direction Z, where the gate trenches 65 penetrate the $n^+$-type emitter region 63 and the p-type base region 62, and reach the $n^-$-type drift region 61. The gate trenches 65 are arranged in a striped layout extending along a direction (a depth direction in FIG. 16) perpendicular to a direction in which the IGBT region 81 and the FWD region 82 are adjacently arranged as viewed from the surface 1a side of the semiconductor substrate 1, for example.

A plurality of gate trenches 65 is arranged from the IGBT region 81 to the FWD region 82 in the same layout. That is, the gate trenches 65 in the FWD region 82 are arranged parallel to the gate trenches 65 in the IGBT region 81 as viewed from the surface 1a side of the semiconductor substrate 1. In the FWD region 82, the gate trenches 65 penetrate the p-type base region 62 (p-type anode region) and reach the $n^-$-type drift region 61.

A gate electrode 67 is provided inside the gate trench 65 via a gate insulating film 66. The field oxide film 41 (see FIGS. 6, 9, and 11) covers the surface 1a of the semiconductor substrate 1 in the edge termination region. The interlayer insulating film 43 is provided on the field oxide film 41 and on the surface 1a of the semiconductor substrate 1 in the active region, and covers the gate electrode 67. An emitter electrode 68 is provided on the interlayer insulating film 43.

The emitter electrode 68 is in contact with the $n^+$-type emitter region 63 and the $p^+$-type contact region 64 via a contact hole that is an opening in the interlayer insulating film 43 in the IGBT region 81. Further, the emitter electrode 68 is in contact with the p-type base region 62 via a contact hole in the interlayer insulating film 43 in the FWD region 82, and serves as an anode electrode. A surface protecting film (not depicted) covers the surface 1a of the semiconductor substrate 1 in the edge termination region.

The n-type FS region 69 is provided in a surface layer of the back 1b of the semiconductor substrate 1 and spans the IGBT region 81 and the FWD region 82. A plurality of n-type FS regions 69 may be arranged in different depths from the back 1b of the semiconductor substrate 1. Further, on the surface layer of the back 1b of the semiconductor substrate 1, at a level shallower than the n-type FS region 69, the $p^+$-type collector region 70 is provided in the IGBT region 81 and the $n^+$-type cathode region 71 is provided in the FWD region 82.

The $p^+$-type collector region 70 is in contact with the $n^+$-type cathode region 71 along the direction in which the IGBT region 81 and the FWD region 82 are arranged. The $p^+$-type collector region 70 and the $n^+$-type cathode region 71 may be in contact with the n-type FS region 69 in the depth direction Z. A collector electrode 72 is provided on the back 1b of the semiconductor substrate 1. The collector electrode 72 is in contact with the $p^+$-type collector region 70, and is also in contact with the $n^+$-type cathode region 71 to serve as a cathode electrode.

Figure 17:
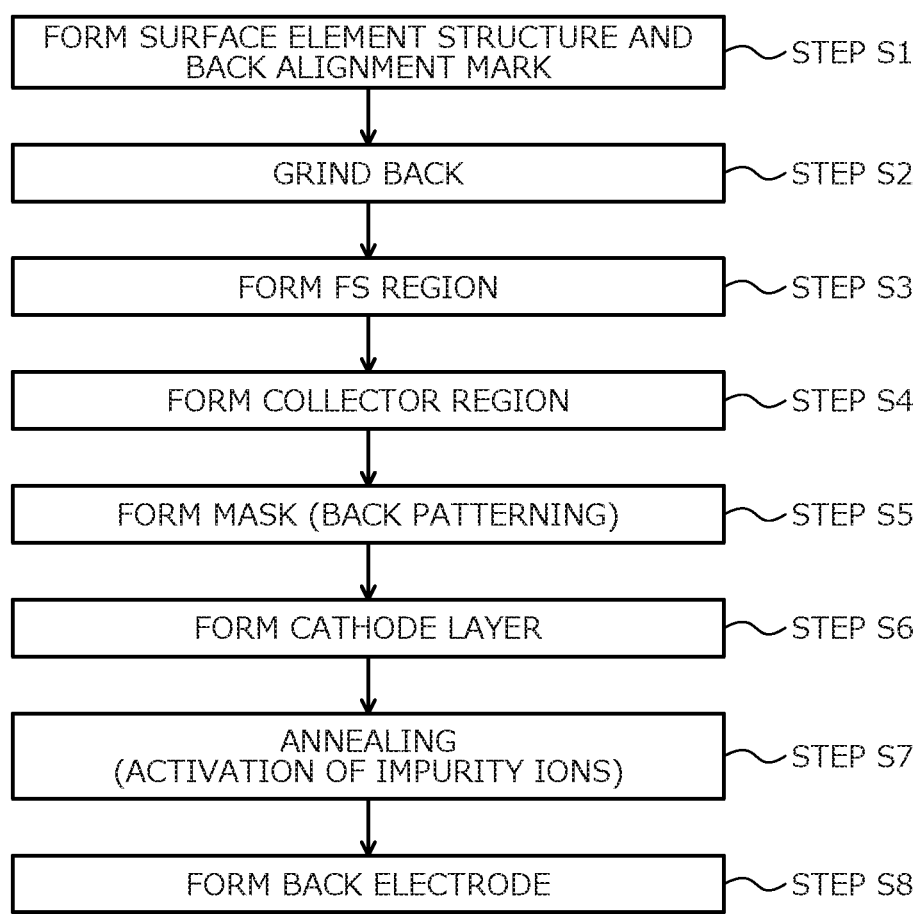
FIG. 17 is a flowchart depicting an outline of a method of manufacturing a semiconductor device according to the third embodiment.

Next, a method of manufacturing a semiconductor device according to the third embodiment (that is, a specific example of the method of manufacturing a semiconductor device according to the first embodiment) is described. FIG. 17 is a flowchart depicting an outline of the method of manufacturing a semiconductor device according to the third embodiment. First, the $n^-$-type semiconductor substrate (semiconductor wafer) 1' is prepared, which is to serve as the $n^-$-type drift region 61. Subsequently, respective portions of the surface element structure 2 and the back alignment mark 3 are formed on the surface 1a side of the semiconductor substrate 1' by ordinary patterning (step S1: see FIGS. 1, 5, and 6).

At step S1, the surface element structure 2 is formed in an active region. A breakdown-voltage structure may be formed in an edge termination region together with the surface element structure 2. The active region and the edge termination region are effective regions (regions to serve as a semiconductor chip) of the semiconductor substrate 1'. The back alignment mark 3 is formed on a dicing line that is an ineffective region of the semiconductor substrate 1', for example. The back alignment mark 3' in FIG. 7 may be formed in place of the back alignment mark 3 in FIGS. 5 and 6.

In the RC-IGBT depicted in FIG. 16, the respective portions of the surface element structure 2 are elements such as the p-type base region 62, the $n^+$-type emitter region 63, the $p^+$-type contact region 64, the gate trenches 65, the gate insulating film 66, the gate electrode 67, the interlayer insulating film 43, the emitter electrode 68, a field oxide film (not depicted), and a surface protecting film (not depicted). In particular, the surface element structure 2 is formed in the following manner, for example.

First, the p-type base region 62 is formed on a surface layer of the surface 1a of the semiconductor substrate 1'. Subsequently, the surface 1a of the semiconductor substrate 1' is subjected to thermal oxidation, so that a field oxide film covering the surface 1a of the semiconductor substrate 1' is formed in the edge termination region. Next, by photolithography and etching, the gate trench 65 is formed penetrating the p-type base region 62 in the depth direction Z and reaching the n⁻-type drift region 61.

At this time, the first and second trenches 33 and 34 (the trenches 31a to 31c: see FIG. 6) are formed as the back alignment mark 3 together with the gate trench 65. The back alignment mark 3' in FIG. 7 may be formed in place of the back alignment mark 3 in FIGS. 5 and 6. In this case, it suffices that the first to third trenches 33, 34, and 36 are formed with the gate trench 65.

Next, thermal oxidation is performed for an inner wall of the gate trench 65, thereby forming the gate insulating film 66 along the inner wall of the gate trench 65. Subsequently, a polysilicon film is deposited (formed) on the surface 1a of the semiconductor substrate 1' in such a manner that the gate trench 65 and the first and second trenches 33 and 34 (or the first to third trenches 33, 34, and 36) are embedded with the polysilicon film. This polysilicon film is then etched back, and the polysilicon film that is to serve as the gate electrode 67 is left in the gate trench 65 via the gate insulating film 66. Also, the polysilicon film 35 is left in the first and second trenches 33 and 34 (or the first to third trenches 33, 34, and 36).

Subsequently, in the IGBT region 81, the n⁺-type emitter region 63 and a p⁺-type contact region 64 are selectively formed inside the p-type region 62. Thereafter, the interlayer insulating film 43 is formed on the surface 1a of the semiconductor substrate 1' so as to cover the gate electrode 67. The interlayer insulating film 43 is then patterned to form a plurality of contact holes that penetrate the interlayer insulating film 43 in the depth direction Z.

In place of the back alignment mark 3 or 3', it is possible to form the back alignment mark 40a or 40a' (see FIGS. 8 to 10) that uses a step formed by the groove 44 or 44' penetrating through the interlayer insulating film 43, the polysilicon film 42, and the field oxide film 41 (the stacked film 45) in the depth direction Z.

Alternatively, in place of the back alignment mark 3 or 3', it is possible to form the back alignment mark 40b (see FIGS. 11 and 12) that uses a step formed by the groove 46 surrounding portions of the interlayer insulating film 43, the polysilicon film 42, and the field oxide film 41 (the stacked film 47).

Subsequently, a metal film containing aluminum (Al) such as a film of aluminum-silicon (Al—Si) is formed on the interlayer insulating film 43 so as to be embedded in the contact holes. The metal film is then patterned in such a manner that a portion of the metal film constituting the emitter electrode 68 is left in a predetermined region (for example, only in an active region). Next, a surface protecting film covering the edge termination region is formed on the surface 1a of the semiconductor substrate 1. With the steps described above, the surface element structure 2 is completed.

Subsequently, the semiconductor substrate 1' is ground from the back 1b' side (back grinding), thereby obtaining the semiconductor substrate 1 having a thickness t1 of a product that is used as a semiconductor device (step S2: see FIG. 2).

Next, the n-type FS region 69 is formed in a surface layer of the back 1b of the semiconductor substrate 1 overall by ion implantation of n-type impurity (step S3). Subsequently, the p⁺-type collector region 70 is formed at a shallower level than the n-type FS region 69 in the surface layer of the back 1b of the semiconductor substrate 1 all over, by ion implantation of p-type impurity (step S4).

Subsequently, resist is applied on the back 1b of the semiconductor substrate 1 to form the resist film 4 (see FIG. 3). Thereafter, a predetermined mask patter is exposed (transferred) on the resist film 4 by using a general exposure device (not depicted), and is developed. In this manner, the resist film 4 is patterned into a predetermined circuit pattern corresponding to the surface element configuration 2 (back patterning), thereby forming a resist mask having an opening corresponding to a region where the n⁺-type cathode region 71 is to be formed (step S5). The process at step S5 corresponds to back patterning (see FIG. 4) of the method of manufacturing a semiconductor device according to the first embodiment.

Next, ion implantation of an n-type impurity is performed using the resist mask as an ion-implantation mask to invert a portion of the p⁺-type collector region 70 to an n⁺-type, thereby forming the n⁺-type cathode region 71 (step S6). In a case where ion implantation of a p-type impurity is performed only for the region where the p⁺-type collector region 70 is to be formed in the process at step S4, the n⁺-type cathode region 71 is formed in an n⁻-type portion exposed in the opening of the resist mask on the back 1b of the semiconductor substrate 1 in the process at step S6.

A sequence of forming the p⁺-type collector region 70 and the n⁺-type cathode region 71 may be interchanged. In this case, the n⁺-type cathode region 71 is formed at the back 1b of the semiconductor substrate 1 overall in the process at step S4, and a resist mask having an opening corresponding to a region where the p⁺-type collector region 70 is to be formed is formed in the process at step S5. Thereafter, it suffices that the p⁺-type collector region 70 is formed using the resist mask as an ion-implantation mask in the process at step S6. The n-type FS region 69 at step S3 may be formed after formation of the p⁺-type collector region 70 and the n⁺-type cathode region 71.

The resist mask is then removed by ashing. Subsequently, annealing (heat treatment) is performed for activating impurities ion-implanted into the semiconductor substrate 1 (step S7). Subsequently, the collector electrode 72 is formed at the back 1b of the semiconductor substrate 1 overall (step S8). Thereafter, the semiconductor substrate 1 is cut (diced) to be separated into individual chips, whereby an RC-IGBT chip (a semiconductor chip) depicted in FIG. 16 is completed.

The semiconductor device according to the third embodiment may be formed by the method of manufacturing a semiconductor device according to the second embodiment. In this case, it suffices that, at step S1, a portion of a metal film that is deposited (formed) on the surface 1a of the semiconductor substrate 1 so as to form the emitter electrode 68 and cover a surface of the back alignment mark 3, 3', 40a, 40a', or 40b as the metal film 52 (see FIGS. 13 and 14).

As described above, the semiconductor device according to the third embodiment may be fabricated by using the method of manufacturing a semiconductor device according to the first or second embodiment.

Figure 18:
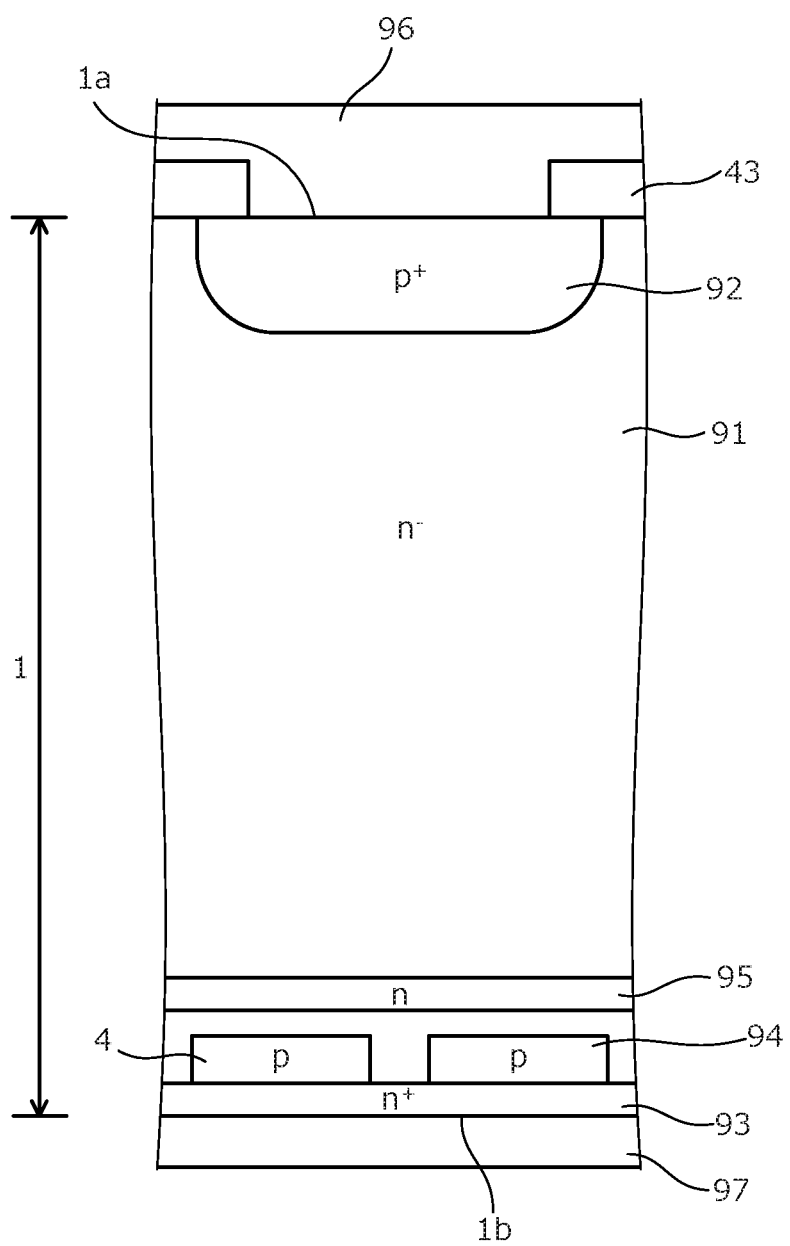
FIG. 18 is a cross-sectional view depicting a structure of the semiconductor device according to a fourth embodiment.

Next, as a semiconductor device according to a fourth embodiment, another structure example of a semiconductor device manufactured by the method of manufacturing a semiconductor device according to the first or second embodiment is described. FIG. 18 is a cross-sectional view depicting a structure of the semiconductor device according to the fourth embodiment. The semiconductor device according to the fourth embodiment depicted in FIG. 18 is an FWD including a p-type floating (electrically floating) region (hereinafter, "p-type floating region") 94 at a deeper level than an n⁺-type cathode region 93 from the back 1b of the n⁻-type semiconductor substrate (semiconductor chip) 1.

FIG. 18 depicts only an active region, and illustrations of an edge termination region surrounding the active region are omitted. Although FIG. 18 depicts one unit cell of the FWD, a plurality of unit cells adjacent to each other may be arranged in the active region. The edge termination region is a region between the active region and a side face of the semiconductor substrate 1, and is a region of an n⁻-type drift region 91 for realizing electric field relaxation on a chip-surface side and sustaining a breakdown voltage. A breakdown-voltage structure such as a guard ring or a field plate may be provided in the edge termination region.

A p⁺-type anode region 92 is selectively provided on a surface layer of the surface 1a of the semiconductor substrate 1. The p⁺-type anode region 92 may be provided at the surface of the semiconductor substrate 1 in the active region overall. An n⁺-type cathode region 93 is provided in a surface layer of the back 1b of the semiconductor substrate 1, spanning the active region and the edge termination region. Further, the p-type floating region 94 is selectively provided in the surface layer of the back 1b of the semiconductor substrate 1 at a deeper level from the back 1b of the semiconductor substrate 1 than is the n⁺-type cathode region 93.

The p-type floating region 94 is arranged in plural at a predetermined interval along a direction parallel to the back 1b of the semiconductor substrate 1. The p-type floating regions 94 are arranged to be separated from a cathode electrode 97 described later and are floating (electrically floating). The p-type floating region 94 may be in contact with the n⁺-cathode region 93. A portion of the semiconductor substrate 1 other than the p⁺-type anode region 92, the n⁺-type cathode region 93, and the p-type floating region 94 is the n-type drift region 91.

An n-type FS region 95 is provided inside the n⁻-type drift region 91, spanning the active region and the edge termination region. The n-type FS region 95 is arranged to be close to the n⁺-type cathode region 93, in the n⁻-type drift region 91. Further, the n-type FS region 95 is arranged at a deeper level from the back 1b of the semiconductor substrate 1 than is the p-type floating region 94. The n-type FS region 95 may be in contact with the n⁺-cathode region 93 and the p-type floating region 94. The n-type FS region 95 may be arranged in plural at differing depths from the back 1b of the semiconductor substrate 1.

The surface 1a of the semiconductor substrate 1 is covered by the field oxide film 41 (see FIGS. 6, 9, and 11) in the edge termination region. The polysilicon film 42 and the interlayer insulating film 43 are stacked on the field oxide film 41 in this order. In a contact hole that is an opening in the interlayer insulating film 43, the p⁺-type anode region 92 is exposed.

An anode electrode 96 is in contact with the p⁺-type anode region 92 via the contact hole in the interlayer insulating film 43. A surface protecting film (not depicted) covers the surface 1a of the semiconductor substrate 1 in the edge termination region. The interlayer insulating film 43, the field oxide film 41, and the surface protecting film surround the active region. The cathode electrode 97 is provided at the back 1b of the semiconductor substrate 1 overall and is in contact with the n⁺-type cathode region 93.

Figure 19:
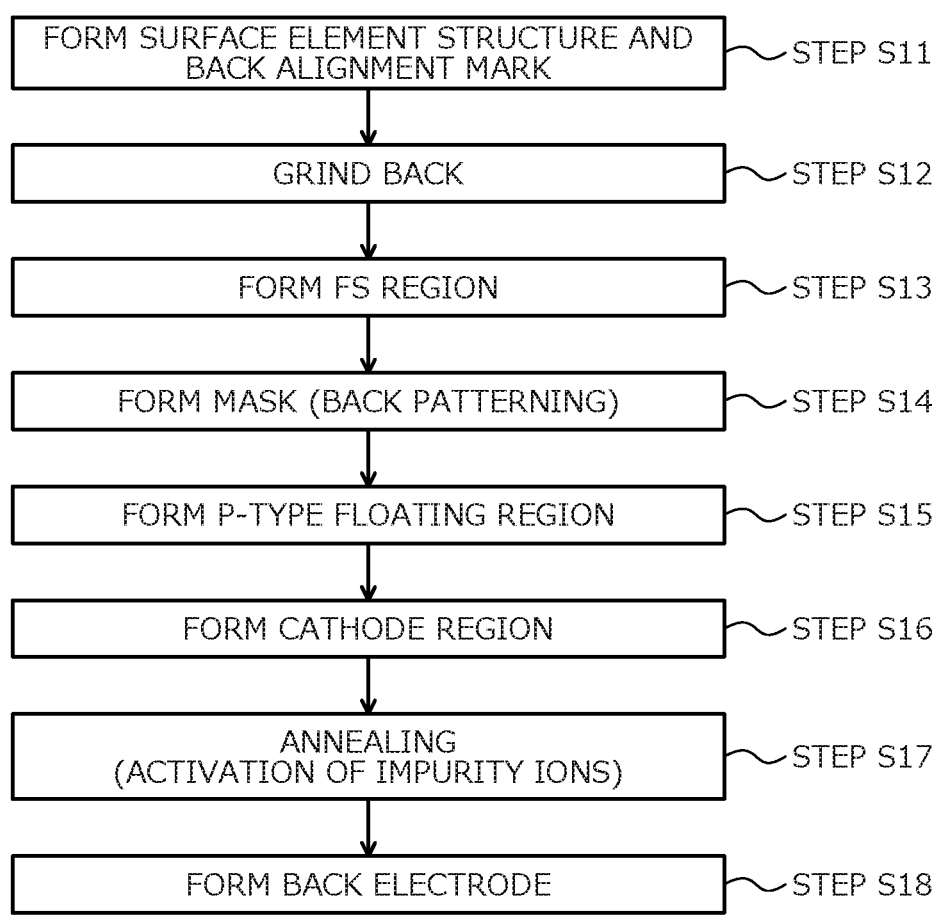
FIG. 19 is a flowchart depicting an outline of a method of manufacturing a semiconductor device according to the fourth embodiment.

Next, a method of manufacturing a semiconductor device according to the fourth embodiment (that is, a specific example of the method of manufacturing a semiconductor device according to the first embodiment) is described. FIG. 19 is a flowchart depicting an outline of the method of manufacturing a semiconductor device according to the fourth embodiment. First, the n⁻-type semiconductor substrate (semiconductor wafer) 1' is prepared, which is to serve as the n⁻-type drift region 91.

Subsequently, respective portions of the surface element structure 2 and the back alignment mark 40a are formed on the surface 1a side of the semiconductor substrate 1' by ordinary patterning (step S11: see FIGS. 1, 8, and 9). Except for the structure of the respective portions of the surface element structure 2 and the structure of the back alignment mark 40a, conditions at step S11 are identical to those in the third embodiment.

The back alignment mark 40a' in FIG. 10 or the back alignment mark 40b in FIGS. 11 and 12 may be formed in place of the back alignment mark 40a. In the FWD depicted in FIG. 18, the respective portions of the surface element structure 2 are the p⁺-type anode region 92, the interlayer insulating film 43, the anode electrode 96, the field oxide film 41 (see FIGS. 8 and 9), and a surface protecting film (not depicted), for example.

In particular, the surface element structure 2 is formed in the following manner, for example. First, the surface 1a of the semiconductor substrate 1' is subjected to thermal oxidation, so that the field oxide film 41 covering the surface 1a of the semiconductor substrate 1' is formed in an edge termination region. Subsequently, the p⁺-type anode region 92 is formed in the surface layer of the surface 1a of the semiconductor substrate 1' in an active region. Thereafter, the interlayer insulating film 43 is formed on the surface 1a of the semiconductor substrate 1'.

Next, the interlayer insulating film 43 is pattered to form a plurality of contact holes that penetrate the interlayer insulating film 43 in the depth direction Z. At this time, along with formation of the contact holes in the interlayer insulating film 43, the back alignment mark 40a (see FIGS. 8 and 9) using a step formed by the groove 44 penetrating through the interlayer insulating film 43, the polysilicon film 42, and the field oxide film 41 (the stacked film 45) in the depth direction Z is formed.

In place of the back alignment mark 40a, the groove 44' may be formed with the stacked film 45' (a portion of the stacked film 45) left therein, and the back alignment mark 40a' (see FIG. 10) using a step formed by that groove 44' may be formed.

Alternatively, in place of the back alignment mark 40a, it is also possible to form the back alignment mark 40b (see FIGS. 11 and 12) that uses a step formed by the groove 46 surrounding portions of the interlayer insulating film 43, the polysilicon film 42, and the field oxide film 41 (the stacked film 47).

Subsequently, for example, a metal film made of an aluminum alloy such as aluminum-silicon is formed on the interlayer insulating film 43 so as to be embedded in the contact holes. The metal film is then patterned in such a manner that a portion thereof that is to serve as the anode electrode 96 is left in a predetermined region (for example, only in the active region). Next, a surface protecting film covering the edge termination region is formed on the surface 1a of the semiconductor substrate 1. With the steps described above, the surface element structure 2 is completed.

Subsequently, similarly to step S2 in the third embodiment, the semiconductor substrate 1' is ground from the back 1b' side (back grinding), thereby obtaining the semiconductor substrate 1 having a thickness t1 of a product that is to be used as a semiconductor device (step S12: see FIG. 2). Similarly to step S3 in the third embodiment, the n-type FS region 95 is formed in a surface layer of the back 1b of the semiconductor substrate 1 (step S13).

Subsequently, resist is applied on the back 1b of the semiconductor substrate 1 to form the resist film 4 (see FIG. 3). Next, a predetermined mask patter is exposed (transferred) on the resist film 4 by using a general exposure device (not depicted), and is developed. In this manner, the resist film 4 is patterned into a predetermined circuit pattern corresponding to the surface element structure 2 (back patterning), thereby forming a resist mask having an opening corresponding to a region where the p-type floating region 94 is to be formed (step S14). The process at step S14 corresponds to back patterning (see FIG. 4) in the method of manufacturing a semiconductor device according to the first embodiment.

Next, ion implantation of a p-type impurity is performed using the resist mask as an ion-implantation mask to form the p-type floating region 94 (step S15). The resist mask is then removed. Subsequently, in the surface layer of the back 1b of the semiconductor substrate 1, at a shallower level from the back 1b of the semiconductor substrate 1 than is the p-type floating region 94, the $n^+$-type cathode region 93 is formed in the back 1b of the semiconductor substrate 1 overall by ion implantation of an n-type impurity (step S16).

The p-type floating region 94 at step S15 may be formed after formation of the $n^+$-type cathode region 93 at step S16. The n-type FS region 95 at step S13 may be formed after formation of the p-type floating region 94 and the $n^+$-type cathode region 93.

Next, annealing (heat treatment) is performed for activating impurities that are ion-implanted into the semiconductor substrate 1 (step S17). Subsequently, the cathode electrode 97 is formed at the back 1b of the semiconductor substrate 1 overall (step S18). Thereafter, the semiconductor substrate 1 is cut (dicing) to be separated into individual chips, whereby a FWD chip (a semiconductor chip) depicted in FIG. 18 is completed.

In a case of forming the semiconductor device according to the fourth embodiment by the method of manufacturing a semiconductor device according to the second embodiment, it suffices that a metal film that is to serve as the anode electrode 96 is left so as to cover the back alignment mark 40a, 40a', or 40b in the patterning of the metal film at step S1.

As described above, the semiconductor device according to the fourth embodiment may be fabricated by using the method of manufacturing a semiconductor device according to the first or second embodiment.

Figure 20:
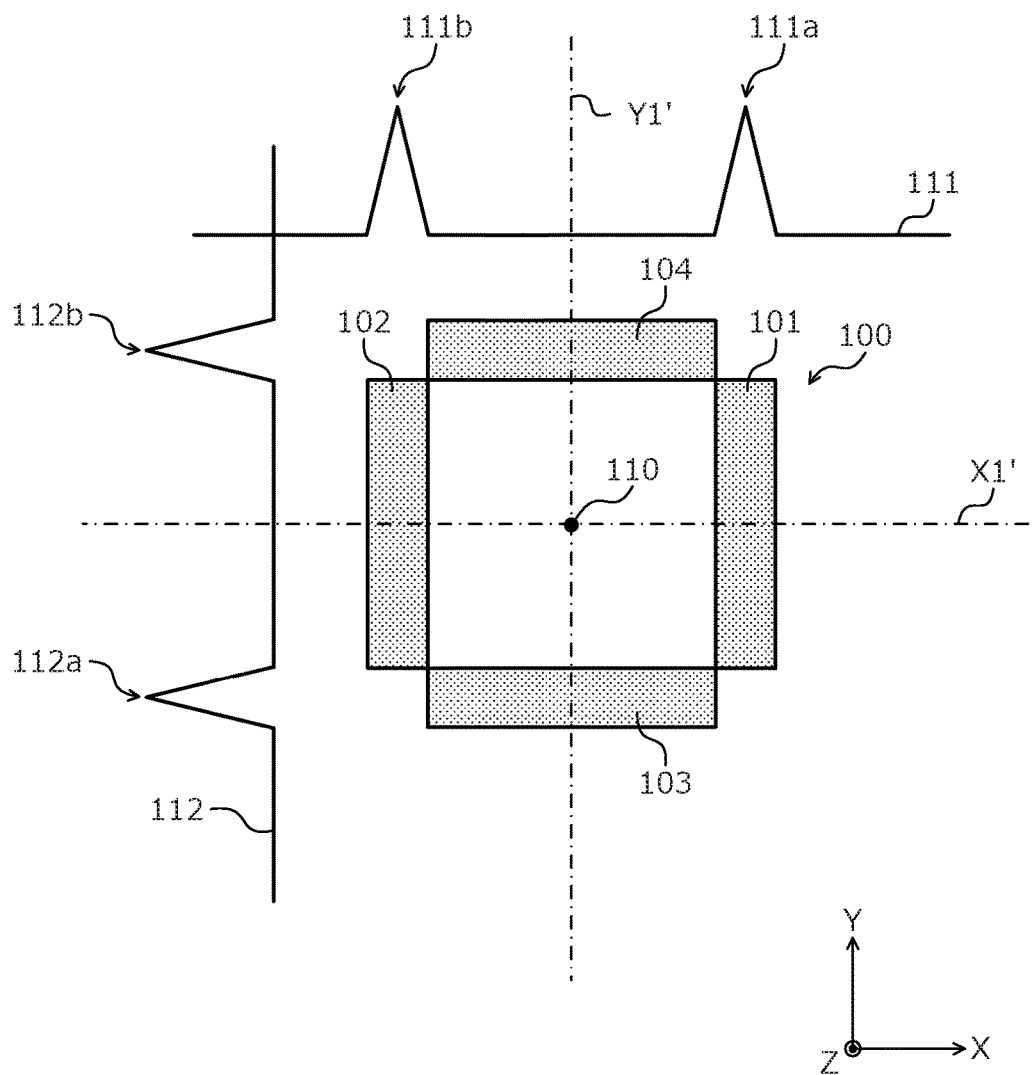
FIG. 20 is an explanatory diagram depicting a detected waveform of reflected light of infrared light irradiated on a semiconductor substrate, from a back of the semiconductor substrate in the method of manufacturing a semiconductor device according to a fifth embodiment.

Next, as a method of manufacturing a semiconductor device according to a fifth embodiment, a method of detecting the back alignment mark 3, 3', 40a, 40a', or 40b (FIGS. 5 to 12) in back patterning (see FIG. 4) is described using a back alignment mark 100 of which a layout as viewed from the surface 1a of the semiconductor substrate 1 is simplified. FIG. 20 is an explanatory diagram depicting a detected waveform of reflected light of infrared light irradiated on a semiconductor substrate, from a back of the semiconductor substrate in the method of manufacturing a semiconductor device according to the fifth embodiment.

FIG. 20 depicts a detected waveform (hereinafter, "first detected waveform") 111 in a direction parallel to the first direction X of one set of mark portions (hereinafter, "first mark portions") 101 and 102 of the back alignment mark 100 and a detected waveform (hereinafter, "second detected waveform") 112 in a direction parallel to the second direction Y of another set of two or more mark portions (hereinafter, "second mark portions") 103 and 104.

As depicted in FIG. 20, the back alignment mark 100 is arranged in a layout that enables detection of two or more peaks in each of the first and second detected waveforms 111 and 112 along the directions that are respectively parallel to the first and second directions X and Y, the first and second detected waveforms 111 and 112 of the reflected light 22 of infrared light irradiated from the back 1b of the semiconductor substrate 1 on the semiconductor substrate 1. In particular, the back alignment mark 100 has one set of two or more first mark portions (two first mark portions denoted with reference signs 101 and 102 are described here as an example) arranged to oppose and be separated from each other along the first direction X and one set of the second mark portions (two second mark portions denoted with reference signs 103 and 104 are described here as an example) arranged to oppose and be separated from each other along the second direction Y.

The first mark portions 101 and 102 of the one set are both straight portions arranged in a linear layout parallel to the second direction Y, for example, as viewed from the surface 1a side of the semiconductor substrate 1. The second mark portions 103 and 104 of the other set are both straight portions arranged in a linear layout parallel to the first direction X, for example, as viewed from the surface 1a side of the semiconductor substrate 1. The back alignment mark 100 is arranged in a rectangular layout including the one set of the first mark portions 101 and 102 as opposing sides and the other set of the second mark portions 103 and 104 as opposing sides as viewed from the surface 1a side of the semiconductor substrate 1.

The first mark portions 101 and 102 and the second mark portions 103 and 104 arranged in the layout configure the back alignment mark 100. With this configuration, peaks 111a and 111b are detected in the first detected waveform 111 parallel to the first direction X of the reflected light 22 of infrared light at positions where the first mark portions 101 and 102 are arranged, respectively. Also, peaks 112a and 112b are detected in the second detected waveform 112 parallel to the second direction Y of the reflected light 22 of infrared light at positions where the second mark portions 103 and 104 are arranged, respectively.

An intersection of a center line Y1' and a center line X1' is set as a center 110 of the back alignment mark 100, the center line Y1' being of the first detected waveform 111 passing through a midpoint between the peaks 111a and 111b generated by the first mark portions 101 and 102 of the one set and parallel to the second direction Y, and the center line X1' being of the second detected waveform 112 passing through a midpoint between the peaks 112a and 112b generated by the second mark portions 103 and 104 of the other set and parallel to the first direction X. In back patterning, alignment may be performed with the position of the center 110 of the back alignment mark 100 as a reference.

As described above, the back alignment mark 100 is configured by one set of first mark portions having two or more straight portions parallel to the second direction Y and another set of second mark portions having two or more straight portions parallel to the first direction X. The position of the center 110 of the back alignment mark 100 is measured based on two or more peaks respectively detected from the first and second detected waveforms 111 and 112 of the reflected light 22 of infrared light, whereby the position of the back alignment mark 100 may be identified.

As the number of peaks detected in each of the first and second detected waveforms 111 and 112 of the reflected light 22 of infrared light is increased, erroneous measurement of the position of the center 110 of the back alignment mark 100 is reduced; however, the size of the back alignment mark 100 becomes larger. Therefore, the back alignment mark 100 may be arranged in a layout in which three peaks are detected in each of the first and second detected waveforms 111 and 112 of the reflected light 22 of infrared light (see FIGS. 5 and 6, for example).

For example, one first mark portion 101 of the one set of the first mark portions 101 and 102 is configured by trenches arranged in a striped layout extending in the second direction Y and a polysilicon film embedded in the trenches. One peak 111a of the first detected waveform 111 of the reflected light 22 of infrared light is formed at a position where the trenches are arranged by a difference in height between the depth of the bottom of the trench from the back 1b of the semiconductor substrate 1 and the depth from the back 1b of the semiconductor substrate 1 to the surface 1a of the semiconductor substrate 1.

For example, the other first mark portion 102 of the one set of the first mark portions 101 and 102 is configured by trenches arranged in a striped layout extending in the second direction Y and a polysilicon film embedded in the trenches. One peak 111b of the first detected waveform 111 of the reflected light 22 of infrared light is formed at a position where the trenches are arranged, by a difference in height between the depth of the bottom of the trench from the back 1b of the semiconductor substrate 1 and the depth from the back 1b of the semiconductor substrate 1 to the surface 1a of the semiconductor substrate 1.

For example, one second mark portion 103 of the other set of the second mark portions 103 and 104 is configured by trenches arranged in a striped layout extending in the first direction X and a polysilicon film embedded in the trenches. One peak 112a of the second detected waveform 112 of the reflected light 22 of infrared light is formed at a position where the trenches are arranged, by a difference in height between the depth of the bottom of the trench from the back 1b of the semiconductor substrate 1 and the depth from the back 1b of the semiconductor substrate 1 to the surface 1a of the semiconductor substrate 1.

For example, the other second mark portion 104 of the other set of the second mark portions 103 and 104 is configured by trenches arranged in a striped layout extending in the first direction X and a polysilicon film embedded in the trenches. One peak 112b of the second detected waveform 112 of the reflected light 22 of infrared light is formed at a position where the trenches are arranged, by a difference in height between the depth of the bottom of the trench from the back 1b of the semiconductor substrate 1 and the depth from the back 1b of the semiconductor substrate 1 to the surface 1a of the semiconductor substrate 1.

FIGS. 21A, 21B, 21C, and 21D are plan views each depicting a layout example of modifications of the back alignment mark 100 in FIG. 20 as viewed from a surface of a semiconductor substrate. FIGS. 21A to 21D depict back alignment marks 100a, 100a', 100b, and 100b' as modifications of the back alignment mark 100 depicted in FIG. 20.

Figure 21A:
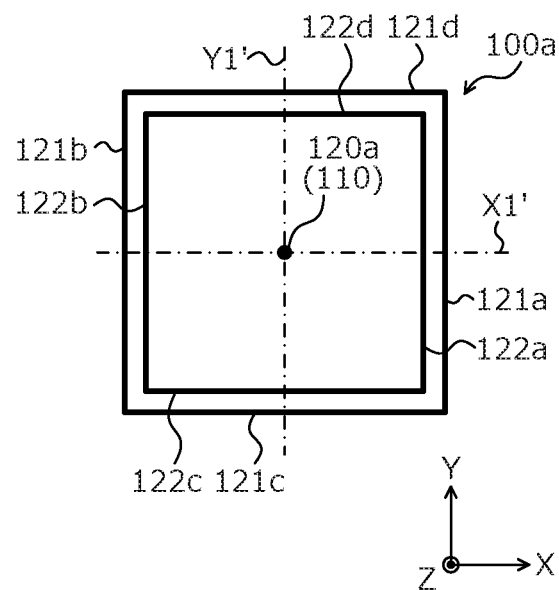
FIG. 21A is a plan view depicting a layout example of modification of a back alignment mark in FIG. 20 as viewed from a surface of a semiconductor substrate.

As depicted in FIG. 21A, the back alignment mark 100a may be configured in such a manner that on orthogonal coordinates XY centered on a predetermined position, trenches 121a and 122a arranged in a striped layout extending in the second direction Y are arranged on a positive side along the first direction X, while trenches 121b and 122b arranged in a striped layout extending in the second direction Y are arranged on a negative side along the first direction X. Also, the back alignment mark 100a may be configured in such a manner that on orthogonal coordinates XY centered on a predetermined position, trenches 121c and 122c arranged in a striped layout extending in the first direction X are arranged on a negative side along the second direction Y, while trenches 121b and 122b arranged in a striped layout extending along the first direction X are arranged on a positive side in the second direction Y.

By arranging the trenches 121a to 121d and 122a and 122d in this manner, the back alignment mark 100a has a configuration in which an inner circumferential trench that includes the trenches 121a to 121d and an outer circumferential trench that includes the trenches 122a to 122d are arranged to surround the center of the orthogonal coordinates XY in a dual manner, where the planar shape of each of the inner circumferential trench and the outer circumferential trench is rectangular. Therefore, in the back alignment mark 100a, four peaks are detected in each of the first and second detected waveforms of the reflected light 22 of infrared light. Accordingly, it suffices that an intersection of the center line Y1' parallel to the second direction Y passing through a center of the four peaks in the first detected waveform and the center line X1' parallel to the first direction X passing through a center of the four peaks in the second detected waveform (that is, a center of the orthogonal coordinates XY) is set as a center 120a of the back alignment mark 100a. The position of the center 120a of the back alignment mark 100a in FIG. 21A is measured at the same position as the center 110 of the back alignment mark 100 in FIG. 20.

Figure 21B:
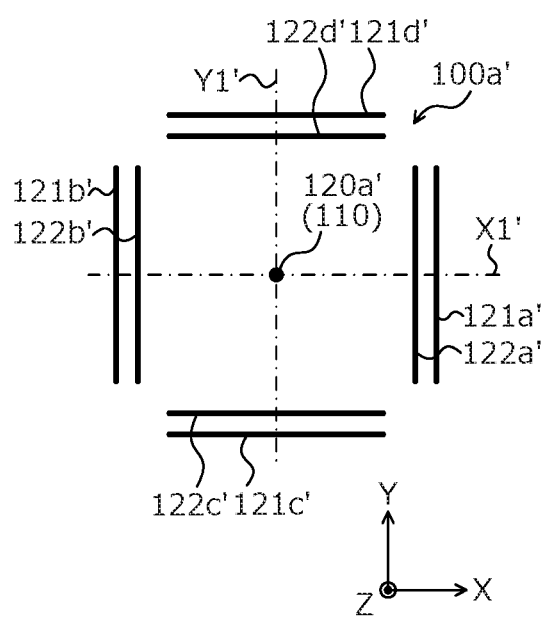
FIG. 21B is a plan view depicting a layout example of modification of the back alignment mark in FIG. 20 as viewed from a surface of a semiconductor substrate.

Among ends of the trenches 121a to 121d configuring a rectangular planar shape of the outer circumferential trench, ends located at the same apex may be in contact with each other (FIG. 21A) or may be separated from each other. Among ends of the trenches 122a to 122d configuring a rectangular planar shape of the inner circumferential trench, ends located at the same apex may be in contact with each other (FIG. 21A) or may be separated from each other. The back alignment mark 100a' depicted in FIG. 21B is an example in which ends of trenches 121a' to 121d', configuring an outer circumferential trench, located at the same apex are separated from each other and ends of trenches 122a' to 122d', configuring an inner circumferential trench, located at the same apex are separated from each other. That is, the back alignment mark 100 may be arranged in a closed rectangular layout (the back alignment mark 100a depicted in FIG. 21A) or in a layout that is open at every apex (the back alignment mark 100a' depicted in FIG. 21B) as viewed from the surface 1a side of the semiconductor substrate 1. The position of a center 120a' of the back alignment mark 100a' in FIG. 21B is measured at the same position as the center 120a of the back alignment mark 100a in FIG. 21A.

Figure 21C:
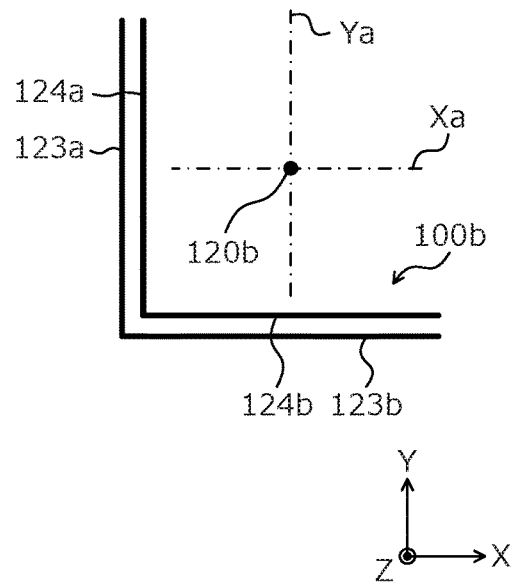
FIG. 21C is a plan view depicting a layout example of modification of the back alignment mark in FIG. 20 as viewed from a surface of a semiconductor substrate.

As depicted in FIG. 21C, the back alignment mark 100b may be configured in such a manner that trenches 123a and 124a arranged straight to extend along the second direction Y parallel to each other and trenches 123b and 124b arranged straight to extend along the first direction X parallel to each other form an L-shaped layout as viewed from the surface 1a side of the semiconductor substrate 1. In the back alignment mark 100b in FIG. 21C, at the center 120b of the back alignment mark 100b, two peaks are generated by the trenches 123a and 124a in the first detected waveform of a line Xa in a direction parallel to the first direction X, and two peaks are generated by the trenches 123b and 124b in the second detected waveform of a line Ya in a direction parallel to the second direction Y.

Figure 21D:
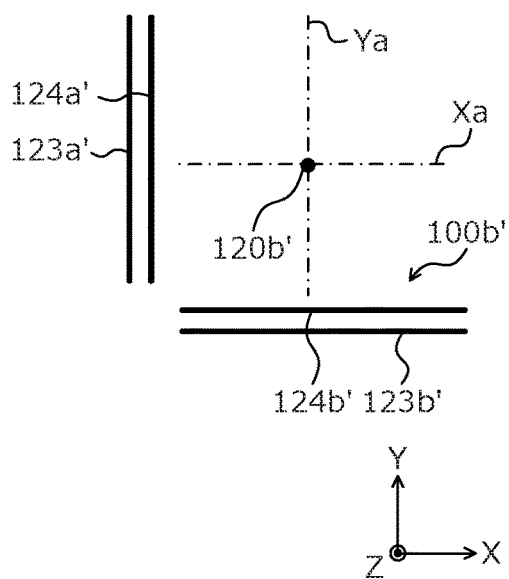
FIG. 21D is a plan view depicting a layout example of modification of the back alignment mark in FIG. 20 as viewed from a surface of a semiconductor substrate.

Ends of the trenches 123a and 123b arranged in an L-shaped layout, located at a corner of an L-shape, may be in contact with each other (FIG. 21C) or may be separated from each other. The trenches 124a and 124b are arranged to be adjacent to the trenches 123a and 123b arranged in an L-shaped layout and to form a double L-shaped layout with these trenches 123a and 123b. Ends of the trenches 124a and 124b, located at a corner of an L-shape, may be in contact with each other (FIG. 21C) or may be separated from each other. The back alignment mark 100b depicted in FIG. 21C is an example in which ends of trenches 123a and 123b are in contact with each other and ends of trenches 124a and 124b are in contact with each other. The back alignment mark 100b' depicted in FIG. 21D is an example in which ends of trenches 123a' and 123b' are separated from each other and ends of trenches 124a' and 124b' are separated from each other. The position of a center 120b' of the back alignment mark 100b' in FIG. 21D may be the same position as the center 120b of the back alignment mark 100b in FIG. 21C.

Although each trench is depicted by a straight line in FIGS. 21A to 21D, it is needless to mention that a polysilicon film (not depicted) is embedded in each trench in the modifications depicted in FIGS. 21A to 21D. Therefore, a peak of the reflected light 22 of infrared light is detected at a position where the trenches are arranged because of a difference in height between the depth of the bottom of the trench from the back 1b of the semiconductor substrate 1 and the depth from the back 1b of the semiconductor substrate 1 to the surface 1a of the semiconductor substrate 1.

Further, each of the back alignment marks 100a and 100a' in FIGS. 21A and 21B and the back alignment marks 100b and 100b' in FIGS. 21C and 21D may be configured by the groove 44 (see FIGS. 8 and 9) or the stacked film 47 remaining between the grooves 46 (see FIGS. 11 and 12) in place of a trench and a polysilicon film in the trench.

Next, the detection accuracy of the back alignment mark 3 or 3' was verified. FIG. 22 depicts detection results of back alignment marks according to a first example. Results of measurement of four back alignment marks (hereinafter, marks 1 to 4) by using an IR microscope of an exposure device are depicted in FIG. 22, where each of the four back alignment marks is configured by a step formed by trenches formed in a semiconductor substrate. The marks 2 to 4 are back alignment marks according to the first embodiment (hereinafter, "first example"). In all of the marks 2 to 4, the thickness (silicon thickness) t1 of the semiconductor substrate 1 was set to 140 μm, and the maximum widths w11 and w12 in the first and second directions X and Y were set to 80 μm for facilitating comparison of visibility and recognition rate.

In particular, the mark 2 is the back alignment mark 3 depicted in FIGS. 5 and 6. That is, the mark 2 has a configuration in which the first trenches 33 in a cross-shaped layout and the second trench 34 surrounding the first trenches 33 in the form of a cross are arranged, so that the three trenches 31a to 31c are arranged. The polysilicon film 35 is embedded in the first and second trenches 33 and 34. Further, in the mark 2, the minimum widths w1 and w2 of the first and second trenches 33 and 34 were both set to 0.8 μm, and a width (a mesa width) w3 between the first and second trenches 33 and 34 was set to 5.2 μm.

The mark 3 is the back alignment mark 3' in FIG. 7. That is, the mark 3 has a configuration in which the first and second trenches 33 and 34 that are identical to those in the mark 2 and the third trench 36 that is separated from the first and second trenches 33 and 34 are arranged, so that five trenches are arranged in a direction parallel to the surface 1a of the semiconductor substrate 1. The polysilicon film 35 is embedded in the first to third trenches 33, 34, and 36. Further, in the mark 3, all the widths of the first to third trenches 33, 34, and 36 were set to 0.8 μm and a width (a mesa width) between the first and third trenches 33 and 36 and a width (a mesa width) between the second and third trenches 34 and 36 were both set to 2.2 μm.

The mark 4 is the back alignment mark 3' in FIG. 7 to which the second embodiment is applied. That is, the mark 4 has a configuration in which the first to third trenches 33, 34, and 36 are arranged as in the mark 3', the polysilicon film 35 is embedded in the first to third trenches 33, 34, and 36, and the first to third trenches 33, 34, and 36 are covered by the metal film 52. The metal film 52 was an aluminum-silicon film. Further, in the mark 4, all the widths of the first to third trenches 33, 34, and 36 were set to 0.8 μm and a width (a mesa width) between the first and third trenches 33 and 36 and a width (a mesa width) between the second and third trenches 34 and 36 were both set to 2.8 μm.

The mark 1 is the back alignment mark 203 of the comparative example (see FIGS. 25 and 30). The mark 1 is configured by a step formed by the trench 204 surrounding a portion of the semiconductor substrate 201 in a cross-shaped planar shape. That is, the mark 1 has a configuration in which two trenches are arranged along a direction parallel to the surface 201a of the semiconductor substrate 201. A polysilicon film is embedded in the trench 204. Further, in the mark 1, a minimum width w201 of the trench 204 was set to 0.8 μm, a width (a mesa width) w202 between the trenches 204 was set to 11.2 μm, widths w211 and w212 in the first and second directions X and Y were set to 80 μm as in the marks 2 to 4, and a thickness t201 of the semiconductor substrate 201 was set to 140 μm.

In addition, FIG. 22 depicts an IR image obtained by irradiating infrared light from a back of a semiconductor substrate (see FIG. 29) and measuring the mark 1 on the surface of the semiconductor substrate from the back of the semiconductor substrate by the detector 223. Also, FIG. 22 depicts images (hereinafter, "IR images") obtained by irradiating infrared light from the back of the semiconductor substrate (see FIG. 4) and measuring the marks 2 to 4 on the surface of the semiconductor substrate from the back of the semiconductor substrate by the detector 23. It was confirmed that, as the density of trenches (the mark 1: not included, the mark 2: the first trenches 33, the mark 3: the first and second trenches 33 and 36) in the trench 204 or 34 having a cross-shaped planar shape became higher, the contrast of the IR image became lower and the mark 3 was difficult to visually recognize. In the mark 4 configured to include the metal film 52 covering the mark 3, it was confirmed that the contrast of the IR image was higher than those in the marks 1 to 3, and all the first to third trenches 33, 34, and 36 were able to be visually recognized clearly.

FIG. 22 also depicts, in the IR images, a detected waveform 241 of the reflected light 222 of infrared light corresponding to the IR image in the comparative example (the mark 1) and detected waveforms 132, 133, and 134 of the reflected light 22 of infrared light respectively corresponding to the IR images of the marks 2 to 4. The detected waveforms 241, 132, 133, and 134 correspond to the first and second detected waveforms 111 and 112 in FIG. 20. The mark 1 is confirmed by the detected waveform 241 of the reflected light 222 of infrared light. The marks 2 and 3 are respectively confirmed by the detected waveforms 132 and 133 of the reflected light 22 of infrared light. In the mark 3 having a narrow mesa width between the trenches, peaks respectively generated by the first to third trenches 33, 34, and 36 were not be able to be separated from the detected waveform 133. Therefore, it may be surmised that, because of the entire reduction of the reflection intensity of the reflected light 22 of infrared light, the contrast between the surface 1a of the semiconductor substrate 1 and the bottom of the trench was lowered.

In the mark 2, it was confirmed that peaks generated by the first and second trenches 33 and 34 were able to be separated from the detected waveform 132. Also in the mark 1, it was confirmed that a peak generated by the trench 204 was able to be separated from the detected waveform 241. Further, it was confirmed that a recognition rate (a detection rate) of the mark 2 was as high as 90%, while a recognition rate of the mark 1 was 80%. It is thought that there are the flowing two reasons. The first reason is that the peaks generated by the first and second trenches 33 and 34 were able to be separated from the detected waveform 132 of the mark 2, as described above. The second reason is that increase of the density of the first trenches 33 within the second trench 34 in the mark 2 as compared to that in the mark 1 contributes to improvement of the contrast in the IR image. In the mark 4 having a configuration in which the metal film 52 covers the mark 3, a recognition rate is further improved as compared to that in the mark 2. Note that stable alignment requires a recognition rate of a back alignment mark of 65% or more.

Next, the detection accuracy of the back alignment marks 40a and 40b was verified. FIG. 23 depicts detection results of back alignment marks according to a second example. Results of measurement of four back alignment marks (hereinafter, marks 5 to 8) by using an IR microscope of an exposure device are depicted in FIG. 23, where the each of the four back alignment marks is configured by a step formed by a groove in a stacked film on a surface of the semiconductor substrate 1. The marks 5 to 8 are a back alignment mark according to the first embodiment (hereinafter, "second example"). In all of the marks 5 to 8, the thickness t1 of the semiconductor substrate 1 was set to 400 μm, and the maximum widths w11 and w12 in the first and second directions X and Y were set to 80 μm for making comparison of visibility and recognition rate easier.

In particular, the mark 5 is the back alignment mark 40a in FIGS. 8 and 9. That is, the mark 5 is configured to include the groove 44 that penetrates the stacked film 45 in the depth direction Z and has a cross-shaped planar shape. As types of films for forming the mark 5 (hereinafter, "types of mark-forming films"), that is, types of films in the stacked film 45, the field oxide film 41 (initial oxidation film), the polysilicon film 42 (poly-Si film), and the interlayer insulating film 43 (BPSG film) were stacked from the surface 1a side of the semiconductor substrate 1 in this order. Further, in the mark 5, maximum widths w14 and w15 in the first and second directions X and Y (the maximum width of the groove 44) were both set to 4.2 μm, and minimum widths w4 and w5 in the first and second directions X and Y (the minimum width of the groove 44) were both set to 1.6 μm.

The mark 6 is the back alignment mark 40b in FIGS. 11 and 12. That is, the mark 6 is configured to include the groove 46 surrounding the stacked film 47. As types of mark-forming films for forming the mark 6, that is, types of films in the stacked film 47, the field oxide film 41 (initial oxidation film), as in the mark 5, the polysilicon film 42 (poly-Si film), and the interlayer insulating film 43 (BPSG film) were stacked from the surface 1a side of the semiconductor substrate 1 in this order. In the mark 6, maximum widths w14' and w15' in the first and second directions X and Y (the maximum left width of the stacked film 47) were both set to 4.2 μm, and minimum widths w4' and w5' in the first and second directions X and Y (the minimum left width of the stacked film 47) were both set to 1.6 μm.

The mark 7 is the back alignment mark 40a in FIGS. 8 and 9 to which the second embodiment is applied. That is, as in the mark 5, the mark 7 has a configuration in which the groove 44 that penetrates the stacked film 45 in the depth direction Z is arranged and the metal film 52 is embedded in the groove 44 so as to cover the groove 44. As types of mark-forming films for forming the mark 7, an aluminum-silicon film was stacked as the metal film 52 on the stacked film 45 that was identical to that in the mark 5 (the field oxide film 41 (initial oxidation film), the polysilicon film 42 (poly-Si film), and the interlayer insulating film 43 (BPSG film)). The maximum widths w14 and w15 of the mark 7 in the first and second directions X and Y and the minimum widths w4 and w5 thereof in the first and second directions X and Y are identical to those in the mark 5.

The mark 8 is the back alignment mark 40b in FIGS. 11 and 12 to which the second embodiment is applied. That is, as in the mark 6, the mark 8 has a configuration in which the groove 46 that surrounds the stacked film 47 is arranged, and that stacked film 47 is covered by the metal film 52. As types of mark-forming films for forming the mark 8, an aluminum-silicon film was stacked as the metal film 52 on the stacked film 47 that was identical to that in the mark 6 (the field oxide film 41 (initial oxidation film), the polysilicon film 42 (poly-Si film), and the interlayer insulating film 43 (BPSG film)). The maximum widths w14' and w15' of the mark 8 in the first and second directions X and Y and the minimum widths w4' and w5' thereof in the first and second directions X and Y are identical to those in the mark 6.

From the results depicted in FIG. 23, it was confirmed that recognition rates of the marks 7 and 8 were higher than those of the marks 5 and 6 in images (IR images) obtained by irradiating infrared light from a back of a semiconductor substrate (see FIG. 4) and measuring the marks 5 to 8 on the surface 1a of the semiconductor substrate 1 from the back 1b of the semiconductor substrate by the detector 23 in accordance with the method of manufacturing a semiconductor device according to the first embodiment. Also in confirmation of the peak intensity (surrounded by a broken circle) in detected waveforms 135 to 138 depicted with the IR images of the marks 5 to 8 in the lowermost line in FIG. 23, it was confirmed that the peak intensity in the detected waveforms 137 and 138 of the marks 7 and 8 was larger than the peak intensity in the detected waveforms 135 and 136 of the marks 5 and 6. That is, also in the back alignment marks 40a and 40b each using a step formed by the stacked film 45 or 47 and the groove 44 or 46, it was confirmed that covering the back alignment mark 40a or 40b by the metal film 52 was able to improve the detection accuracy.

Next, a suitable range of the thickness (the product thickness to be used as a semiconductor device) t1 of the semiconductor substrate 1 was verified. FIG. 24 depicts a suitable range of a thickness of a semiconductor substrate according to a third example. Results of fabricating RC-IGBTs (see FIG. 16) by varying thicknesses (Si thicknesses) t1 of the semiconductor substrate 1 in accordance with the method of manufacturing a semiconductor device according to the third embodiment are depicted in FIG. 24 (no covering metal film: RC-IGBT). Results of fabricating FWDs (see FIG. 18) by varying thicknesses t1 of the semiconductor substrate 1 in accordance with the method of manufacturing a semiconductor device according to the fourth embodiment are depicted in FIG. 24 (no covering metal film: FWD).

Further, results of fabricating RC-IGBTs (see FIG. 16) by varying thicknesses t1 of the semiconductor substrate 1 by the method of manufacturing a semiconductor device according to the third embodiment to which the second embodiment (that is, covering the back alignment mark 3 by the metal film 52) is applied are depicted in FIG. 24 (with covering metal film: RC-IGBT). Results of fabricating FWDs (see FIG. 18) by varying thicknesses t1 of the semiconductor substrate 1 by the method of manufacturing a semiconductor device according to the fourth embodiment to which the second embodiment (that is, covering the back alignment mark 40a by the metal film 52) is applied are depicted in FIG. 24 (with covering metal film: FWD).

From the results of "no covering metal film: RC-IGBT" in FIG. 24, it was confirmed that the upper limit of the thickness t1 of the semiconductor substrate 1 was 150 μm in a case of forming the back alignment mark 3 or 3' using a step formed by a trench. From the results of "with covering metal film: RC-IGBT" in FIG. 24, it was confirmed that when the configuration "with covering metal film" was employed, the detection accuracy of the back alignment marks 3 and 3' each using a step formed by a trench and the detection accuracy of the back alignment marks 40a, 40a', and 40b each using a step formed by a groove penetrating through a stacked film were higher than in configuration "no covering metal film", and the thickness t1 of the semiconductor substrate 1 were able to be increased. In a case of "with covering metal film", the upper limit of the thickness t1 of the semiconductor substrate 1 is 400 μm.

The present invention is not limited to the above embodiments, and may be variously modified without departing from the scope of the invention. For example, in the third and fourth embodiments described above, there has been described a case of manufacturing an RC-IGBT and a case of manufacturing an FWD as examples. However, the present invention may be applied to a semiconductor device that is fabricated by performing patterning of a second main surface that is different from a first main surface having an alignment mark formed thereon by using the alignment mark. Even when the conductive type (n-type and p-type) is reversed in the third and fourth embodiments, these embodiments may be realized in a similar manner.

A method of manufacturing a semiconductor device according to the present invention includes performing with respect to a semiconductor substrate having a first main surface and a second main surface substantially parallel to each other, patterning of the second main surface that is different from the first main surface having an alignment mark formed thereon by using the alignment mark. This method may improve the detection accuracy of the alignment mark and therefore, has an advantageous effect of improving alignment accuracy.

As described above, the method of manufacturing a semiconductor device according to the present invention is useful for a semiconductor device that is fabricated (manufactured) by performing patterning of a second main surface that is different from a first main surface having an alignment mark formed thereon by using the alignment mark, and is particularly suitable for an RC-IGBT and an FWD that has a p-type floating region at a deeper level from a back of a semiconductor substrate than an $n^+$-type cathode region.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:

forming a surface element structure and a predetermined mark separated from the surface element structure on a first main surface of a semiconductor substrate;

forming a resist film on a second main surface of the semiconductor substrate;

irradiating light having a wavelength in a predetermined wavelength region, the light being irradiated on the semiconductor substrate, from the second main surface of the semiconductor substrate, and detecting reflected light of the light by a detector disposed at a position opposing the second main surface of the semiconductor substrate, and identifying a position of the predetermined mark;

performing alignment using the identified position of the predetermined mark as a reference, and transferring to the resist film and exposing a predetermined pattern corresponding to the surface element structure; and performing etching or ion-implantation of an impurity using the resist film as a mask, and forming a back element structure of the predetermined pattern on the second main surface of the semiconductor substrate, wherein forming the surface element structure and the predetermined mark includes forming a plurality of trenches that reach a predetermined depth from the first main surface of the semiconductor substrate, the plurality of trenches being formed in a layout by which two or more peaks are detected in each of a detected waveform in a first direction and a detected waveform in a second direction, of the reflected light, the first direction being parallel to the first main surface of the semiconductor substrate and the second direction being parallel to the first main surface of the semiconductor substrate and perpendicular to the first direction, and a step formed on the first main surface of the semiconductor substrate by the plurality trenches constitutes the predetermined mark.

2. The method according to claim 1, wherein the plurality of trenches are formed in a layout in which three or more of the plurality of trenches are disposed in the first direction, and three or more of the plurality of trenches are disposed in the second direction.

3. The method according to claim 1, wherein a first trench and a second trench are formed as the plurality of trenches, the first trench being disposed in a cross-shaped layout and the second trench being disposed separated from the first trench, in a layout along the first trench and surrounding the first trench in a form of a cross.

4. The method according to claim 3, wherein four trench segments having a straight planar shape are formed as the first trench, the four trench segments being disposed separated from each other in a cross-shaped layout having a center at a predetermined position and in which one end of each of the four trench segments is located at the center.

5. The method according to claim 1, wherein forming the surface element structure and the predetermined mark includes embedding a polysilicon film in the trench.

6. The method according to claim 1, wherein forming the surface element structure and the predetermined mark includes covering the predetermined mark by a metal film.

7. The method according to claim 1, wherein the light is infrared light.

8. A method of manufacturing a semiconductor device, the method comprising:
- forming a surface element structure and a predetermined mark separated from the surface element structure on a first main surface of a semiconductor substrate;
- forming a resist film on a second main surface of the semiconductor substrate;
- irradiating light having a wavelength in a predetermined wavelength region, the light being irradiated on the semiconductor substrate, from the second main surface of the semiconductor substrate, and detecting reflected light of the light by a detector disposed at a position opposing the second main surface of the semiconductor substrate, and identifying a position of the predetermined mark;
- performing alignment using the identified position of the predetermined mark as a reference, and transferring to the resist film and exposing a predetermined pattern corresponding to the surface element structure; and
- performing etching or ion-implantation of an impurity using the resist film as a mask, and forming a back element structure of the predetermined pattern on the second main surface of the semiconductor substrate, wherein
- forming the surface element structure and the predetermined mark includes:
  - forming on the first main surface of the semiconductor substrate, a stacked film constituted by an oxide film, a polysilicon film, and an interlayer insulating film that are sequentially stacked; and
  - forming a groove that penetrates the stacked film in a depth direction, and
- a step formed on the stacked film by the groove constitutes the predetermined mark.

9. The method according to claim 8, wherein
forming the surface element structure and the predetermined mark includes forming the groove to have a cross-shaped planar shape.

10. The method according to claim 8, wherein
forming the surface element structure and the predetermined mark includes forming the groove so that a portion of the stacked film remains having a cross-shaped planar shape and the groove surrounds the portion of the stacked film.

11. The method according to claim 8, wherein
forming the surface element structure and the predetermined mark includes covering the predetermined mark by a metal film.

12. The method according to claim 8, wherein
the light is infrared light.

\* \* \* \* \*

UNITED STATES PATENT AND TRADEMARK OFFICE
CERTIFICATE OF CORRECTION

PATENT NO. : 10,490,508 B2  
APPLICATION NO. : 16/166529  
DATED : November 26, 2019  
INVENTOR(S) : Naoko Kodama Page 1 of 1

It is certified that error appears in the above-identified patent and that said Letters Patent is hereby corrected as shown below:

On the Title Page

Item (56), In Foreign Patent Documents, delete "2012-895540 A" and insert -- 2012-89540 A --, therefor.

Signed and Sealed this
Eleventh Day of February, 2020

Andrei Iancu
*Director of the United States Patent and Trademark Office*